(12) United States Patent
Bolender

(10) Patent No.: US 11,029,349 B2
(45) Date of Patent: Jun. 8, 2021

(54) CAPACITIVE SENSING ACTIVE ELECTROMAGNETIC EMISSION CANCELLATION

(71) Applicant: Synaptics Incorporated, San Jose, CA (US)

(72) Inventor: Robert J. Bolender, San Jose, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 16/898,266

(22) Filed: Jun. 10, 2020

(65) Prior Publication Data

US 2020/0300900 A1    Sep. 24, 2020

Related U.S. Application Data

(63) Continuation-in-part of application No. 15/482,941, filed on Apr. 10, 2017.

(60) Provisional application No. 62/438,400, filed on Dec. 22, 2016.

(51) Int. Cl.
*G01R 27/26* (2006.01)
*G06F 3/044* (2006.01)

(52) U.S. Cl.
CPC ..... *G01R 27/2605* (2013.01); *G01R 27/2658* (2013.01); *G06F 3/044* (2013.01)

(58) Field of Classification Search
CPC ...... G06F 3/041; G06F 3/0412; G06F 3/0414; G06F 3/044; G06F 3/047; G06F 3/048; G06F 3/046; G01R 27/2605
USPC .................................................. 345/173–179
See application file for complete search history.

(56) References Cited

U.S. PATENT DOCUMENTS

| 8,902,178 | B2 | 12/2014 | Han |
| 2012/0013563 | A1 | 1/2012 | Chou et al. |
| 2013/0120310 | A1 | 5/2013 | Siska |
| 2013/0215053 | A1* | 8/2013 | Lin ..................... G06F 3/04184 345/173 |
| 2014/0071360 | A1 | 3/2014 | Chang et al. |
| 2014/0092051 | A1 | 4/2014 | Weinerth et al. |
| 2014/0111442 | A1 | 4/2014 | Cok et al. |
| 2014/0192015 | A1 | 7/2014 | Yamaguchi et al. |
| 2015/0091849 | A1* | 4/2015 | Ludden ................. G06F 3/0412 345/174 |

(Continued)

FOREIGN PATENT DOCUMENTS

KR    10-1678055 B1    11/2016

OTHER PUBLICATIONS

International Search Report and Written Opinion, dated Jun. 4, 2018, from PCT Application No. PCT/US2017/066592, pp. 1-20.

*Primary Examiner* — Alexander Eisen
*Assistant Examiner* — Nelson Lam
(74) *Attorney, Agent, or Firm* — Paradice & Li LLP

(57) ABSTRACT

An input device is disclosed that provides reduced electromagnetic emissions while detecting the presence of an input object. In one embodiment, a first set of sensor electrodes is driven with a first modulated signal while a second set of sensor electrodes is driven with a second set of modulated signals that is based on an inverted first modulated signal. The first set of sensor electrodes may determine a capacitance value while the second set of sensor electrodes may reduce electromagnetic emissions associated with the first set of sensor electrodes.

19 Claims, 12 Drawing Sheets

(56) References Cited

U.S. PATENT DOCUMENTS

| | | | |
|---|---|---|---|
| 2015/0309612 A1* | 10/2015 | Morein | G06F 3/0443 |
| | | | 345/174 |
| 2015/0378495 A1* | 12/2015 | Losh | G06F 3/0446 |
| | | | 345/174 |
| 2016/0041654 A1 | 2/2016 | Bulea et al. | |
| 2016/0103525 A1* | 4/2016 | Snelgrove | G06F 3/0446 |
| | | | 345/174 |
| 2016/0195961 A1 | 7/2016 | Ludden | |
| 2016/0253001 A1* | 9/2016 | Sugita | G06F 3/04166 |
| | | | 345/174 |
| 2018/0181251 A1* | 6/2018 | Bolender | G06F 3/0416 |
| 2019/0278396 A1* | 9/2019 | Shepelev | G06F 3/044 |
| 2020/0201474 A1* | 6/2020 | Shepelev | G06F 3/045 |

* cited by examiner

CAPACITIVE SENSING ACTIVE ELECTROMAGNETIC EMISSION CANCELLATION

CROSS-REFERENCE TO RELATED APPLICATIONS

This application is a continuation-in-part of U.S. patent application Ser. No. 15/482,941, entitled "CAPACITIVE SENSING ACTIVE ELECTROMAGNETIC EMISSION CANCELLATION," filed on Apr. 10, 2017, which claims the benefit of U.S. Provisional Patent Application No. 62/438,400, entitled "CAPACITIVE SENSING ACTIVE ELECTROMAGNETIC EMISSION CANCELLATION," filed Dec. 22, 2016; the aforementioned applications are incorporated by reference herein in their entirety.

TECHNICAL FIELD

The present embodiments relate generally to electronic devices, and specifically to techniques for active reduction of electromagnetic emissions from an input device using a plurality of sensor electrodes.

BACKGROUND OF RELATED ART

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

One innovative aspect of the subject matter disclosed herein may be implemented as a method. The method may be used to reduce electromagnetic emissions associated with an input device. The method may include driving, during a first time period, a first set of sensor electrodes with a first modulated signal. The method may also include generating a second modulated signal based at least in part on an inversion of the first modulated signal and then driving a second set of sensor electrodes with the second modulated signal to reduce electromagnetic emissions associated with the first set of sensor electrodes. The method may further include determining a first capacitance value associated with the first set of sensor electrodes.

Another innovative aspect of the subject matter disclosed herein may be implemented as an input device. The input device may include an array of sensor electrodes comprising a first set of sensor electrodes, and a second set of sensor electrodes. The input device may also include a processing system. The processing system may be configured to drive, during a first time period, the first set of sensor electrodes with a first modulated signal and generate a second modulated signal based at least in part on an inversion of the first modulated signal. The processing system may drive the second set of sensor electrodes with the second modulated signal to reduce electromagnetic emissions associated with the first set of sensor electrodes. The processing system may also be configured to determine a first capacitance value associated with the first set of sensor electrodes.

Another innovative aspect of the subject matter disclosed herein may be implemented as another input device. The input device may include a means for driving, during a first time period, a first set of sensor electrodes with a first modulated signal and a means for generating a second modulated signal based at least in part on an inversion of the first modulated signal. The input device may further comprise a means for driving a second set of sensor electrodes with the second modulated signal to reduce electromagnetic emissions associated with the first set of sensor electrodes. The input device may also include a means for determining a first capacitance value associated with the first set of sensor electrodes.

BRIEF DESCRIPTION OF THE DRAWINGS

The present embodiments are illustrated by way of example and are not intended to be limited by the figures of the accompanying drawings.

DETAILED DESCRIPTION

Figure 1:
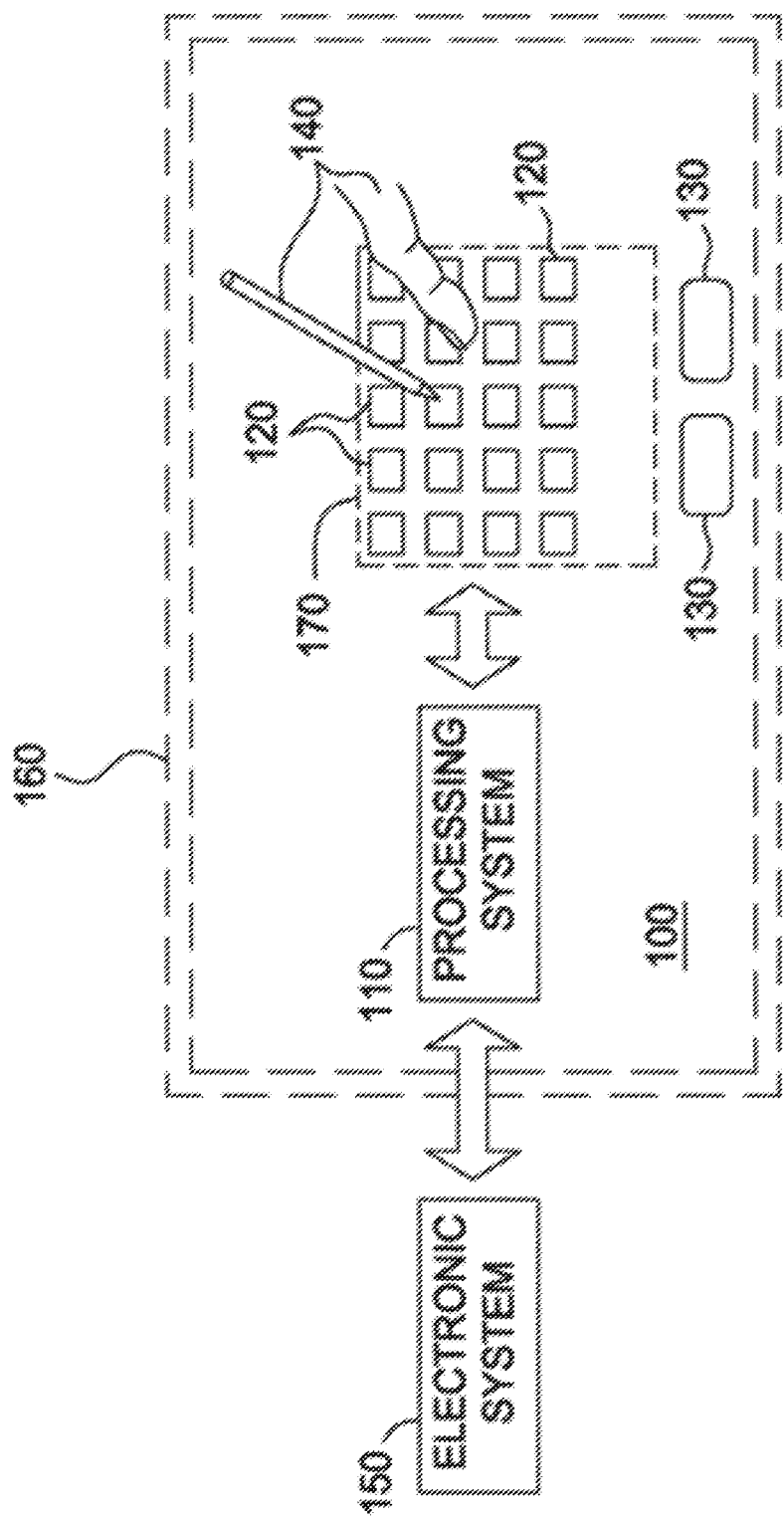
FIG. 1 is a schematic block diagram of an input device, according to embodiments described herein.

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the aspects of the disclosure. However, it will be apparent to one skilled in the art that these specific details may not be required to practice the example embodiments. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory. The interconnection between circuit elements or software (SW) blocks may be shown as buses or as single signal lines. Each of the buses may alternatively be a single signal line, and each of the single signal lines may alternatively be buses, and a single line or bus may represent any one or more of a myriad of physical or logical mechanisms for communication between components.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The techniques described herein may be implemented in hardware, SW, firmware, or any combination thereof, unless specifically described as being implemented in a specific manner. Any features described as modules or components may also be implemented together in an integrated logic device or separately as discrete but interoperable logic devices. If implemented in SW, the techniques may be realized at least in part by a non-transitory computer-readable storage medium comprising instructions that, when executed, performs one or more of the methods described above. The non-transitory computer-readable storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors. The term "processor," as used herein may refer to any general-purpose processor, conventional processor, controller, microcontroller, and/or state machine capable of executing scripts or instructions of one or more SW programs stored in memory.

Aspects of the present disclosure provide input devices and methods for reducing electromagnetic emissions. An input device may comprise a processing system, a first set of sensor electrodes, and a second set of sensor electrodes. During a first time period, the first set of sensor electrodes may be driven with a first modulated signal and the second set of sensor electrodes may be driven with a second modulated signal. The second modulated signal may be an inverted version of the first modulated signal. The first modulated signal may be used to perform capacitance measurement while the second modulated signal may be used to mitigate electromagnetic emissions associated with the first modulated signal. In some implementations, during a second time period, the second set of sensor electrodes may be driven with the first modulated signal and the first set of sensor electrodes may be driven by the second modulated signal. In this manner, an entire sensing region may be scanned for an input object (detected through capacitance measurements) in two time periods.

FIG. 1 is a schematic block diagram of an input device 100, in accordance with embodiments of the present technology. In various embodiments, input device 100 comprises a display device integrated with a sensing device. The input device 100 may be configured to provide input to an electronic system 150. As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, personal digital assistants (PDAs), car dashboard displays, electronic mirrors ("e-mirrors"), and various other automotive components. Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Example communication protocols include Inter-Integrated Circuit (I²C), Serial Peripheral Interface (SPI), Personal System/2 (PS/2), Universal Serial Bus (USB), Bluetooth®, Radio Frequency (RF), and Infrared Data Association (IrDA) communication protocols.

In FIG. 1, the input device 100 is shown as a proximity sensor device (also often referred to as a "touchpad" or a "touch sensor device") configured to sense input provided by one or more input objects 140 in a sensing region 170. Example input objects include fingers and styli, as shown in FIG. 1.

Sensing region 170 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 170 extends from a surface of the input device 100 in one or more directions into space until signal-to-noise ratios prevent sufficiently accurate object detection. The distance to which this sensing region 170 extends in a particular direction, in various embodiments, may be on the order of less than a millimeter, millimeters, centimeters, or more, and may vary significantly with the type of sensing technology used and the accuracy desired. Thus, in some embodiments, sensing input may comprise no contact with any surfaces of the input device 100, contact with an input surface (e.g., a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 170 has a rectangular shape when projected onto an input surface of the input device 100.

The input device 100 may utilize any combination of sensor components and sensing technologies to detect user input in the sensing region 170. The input device 100 comprises a plurality of sensor electrodes 120 for detecting user input. The input device 100 may include one or more sensor electrodes 120 that are combined to form sensor electrodes. Some implementations are configured to provide images that span one, two, three, or higher dimensional spaces. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensor electrodes 120 to create electric fields. In some capacitive implementations, separate sensor electrodes 120 may be ohmically shorted together to form larger sensor electrodes. Some capacitive implementations utilize resistive sheets, which may be uniformly resistive.

As discussed above, some capacitive implementations utilize "self-capacitance" (or "absolute capacitance") sensing methods based on changes in the capacitive coupling between sensor electrodes 120 and an input object. In one embodiment, processing system 110 is configured to drive a voltage with known amplitude onto the sensor electrode 120 and measure the amount of charge required to charge the sensor electrode to the driven voltage. In other embodiments, processing system 110 is configured to drive a known current and measure the resulting voltage. In various embodiments, an input object near the sensor electrodes 120 alters the electric field near the sensor electrodes 120, thus changing the measured capacitive coupling. In one implementation, an absolute capacitance sensing method operates by modulating sensor electrodes 120 with respect to a reference voltage (e.g., system ground) using a modulated signal, and by detecting the capacitive coupling between the sensor electrodes 120 and input objects 140.

In FIG. 1, the processing system 110 is shown as part of the input device 100. The processing system 110 is configured to operate the hardware of the input device 100 to detect input in the sensing region 170. The processing system 110 comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes. In some embodiments, the processing system 110 also comprises electronically-readable instructions, such as firmware code, software code, and/or the like. In some embodiments, components composing the processing system 110 are located together, such as near sensor electrode(s) 120 of the input device 100. In other embodiments, components of processing system 110 are physically separate with one or more components close to sensor electrode(s) 120 of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a mobile device and the processing system 110 may comprise circuits and firmware that are part of a main processor of the mobile device. Example mobile devices may include, but are not limited to, mobile phones, car dashboard displays, electronic mirrors ("e-mirrors"), and the like. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensor electrodes 120 to detect input, identification modules configured to identify gestures such as mode changing gestures, and mode changing modules for changing operation modes. Processing system 110 may also comprise one or more controllers.

In some embodiments, the processing system 110 responds to user input (or lack of user input) in the sensing region 170 directly by causing one or more actions. Example actions include changing operation modes, as well as graphical user interface (GUI) actions such as cursor movement, selection, menu navigation, and other functions. In some embodiments, the processing system 110 provides information about the input (or lack of input) to some part of the electronic system (e.g., to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensor electrode(s) 120 of the input device 100 to produce electrical signals indicative of input (or lack of input) in the sensing region 170. The processing system 110 may perform any appropriate amount of processing on the electrical signals in producing the information provided to the electronic system. For example, the processing system 110 may digitize analog electrical signals obtained from the sensor electrodes 120. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 170, or some other functionality. FIG. 1 shows buttons 130 near the sensing region 170 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 170 overlaps at least part of an active area of a display screen of the display device 160. For example, the input device 100 may comprise substantially transparent sensor electrodes 120 overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display device 160 may share physical elements. For example, some embodiments may utilize some of the same electrical components for displaying and sensing. As another example, the display device 160 may be operated in part or in total by the processing system 110.

It should be understood that while many embodiments of the present technology are described in the context of a fully functioning apparatus, the mechanisms of the present technology are capable of being distributed as a program product (e.g., software) in a variety of forms. For example, the mechanisms of the present technology may be implemented and distributed as a software program on information bearing media that are readable by electronic processors (e.g., non-transitory computer-readable and/or recordable/writable information bearing media readable by the processing system 110). Additionally, the embodiments of the present technology apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
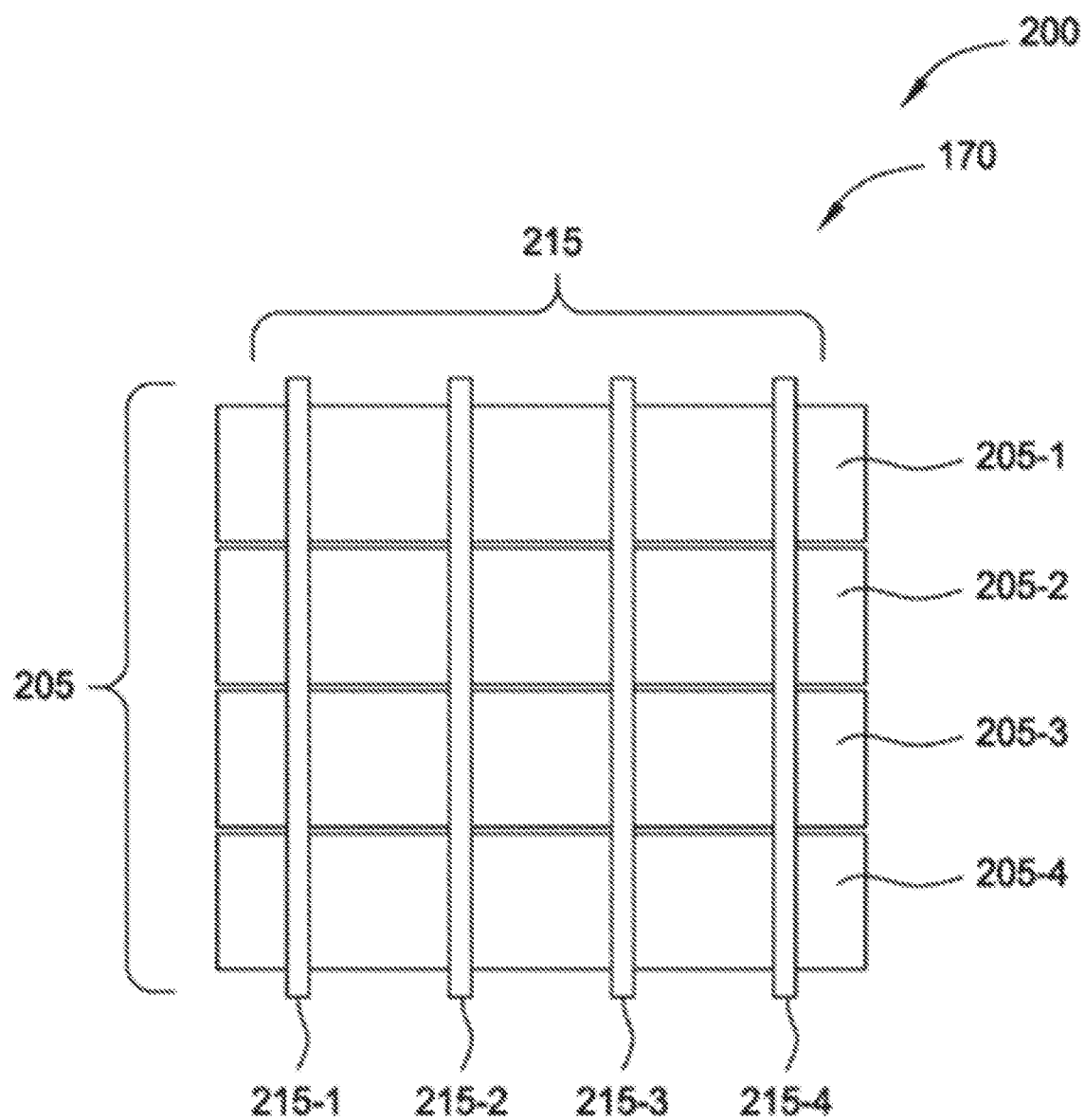
FIGS. 2 and 3 illustrate portions of exemplary sensor electrode implementations, according to embodiments described herein.
Figure 3:
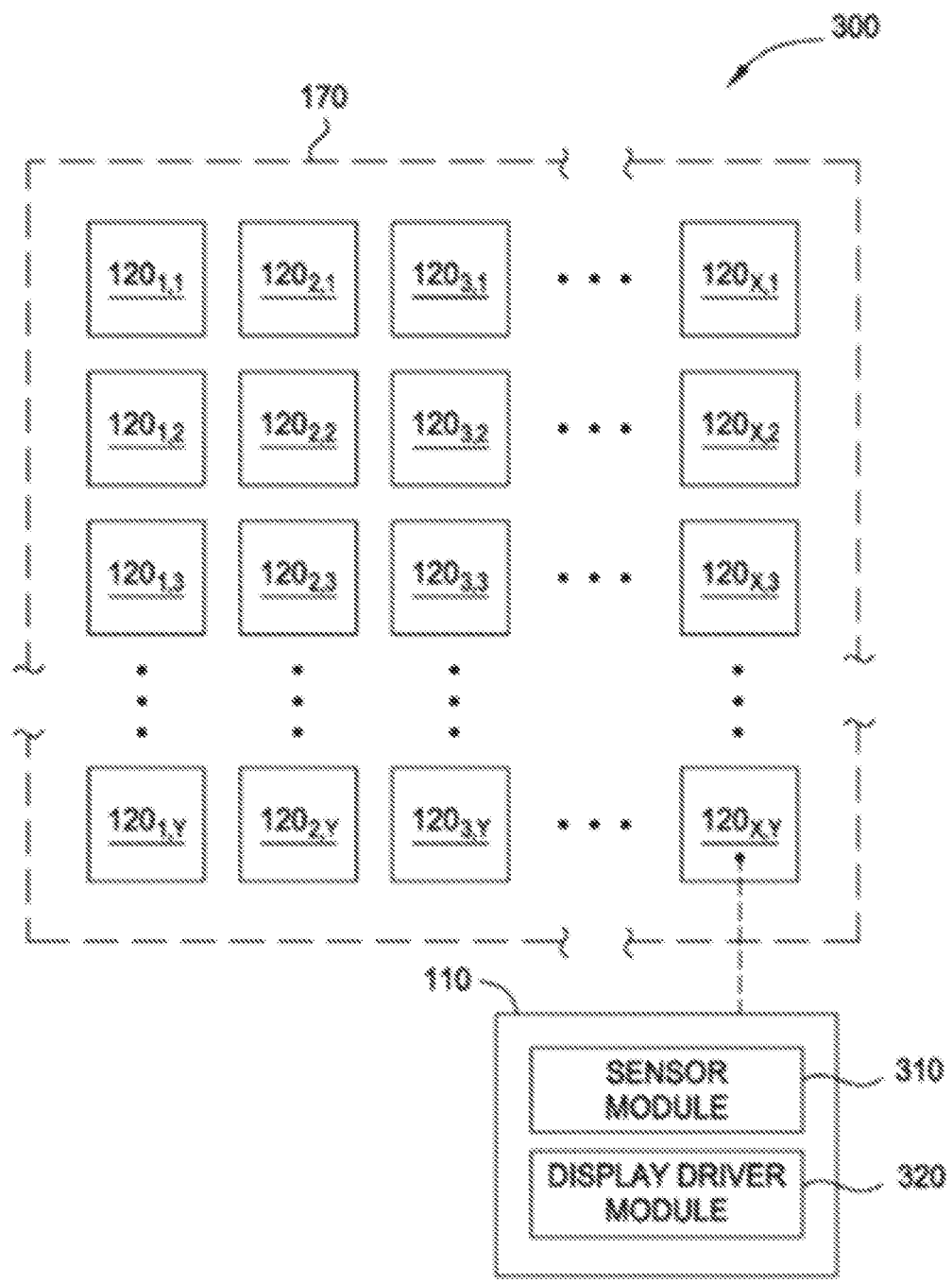

FIGS. 2 and 3 illustrate portions of exemplary sensor electrode arrangements, according to embodiments described herein. Specifically, arrangement 200 (FIG. 2) illustrates a portion of a pattern of sensor electrodes configured to sense in a sensing region 170 associated with the pattern, according to several embodiments. For clarity of illustration and description, FIG. 2 shows the sensor electrodes in a pattern of simple rectangles, and does not show various associated components. This pattern of sensing electrodes comprises a plurality of first sensor electrodes 205 (e.g., 205-1, 205-2, 205-3, and 205-4), and a plurality of second sensor electrodes 215 (e.g., 215-1, 215-2, 215-3, and 215-4). The sensor electrodes 205 and 215 are each examples of the sensor electrodes 120 discussed above. In one embodiment, processing system 110 operates the plurality of first sensor electrodes 205 as a plurality of transmitter electrodes, and the plurality of second sensor electrodes 215 as a plurality of receiver electrodes. In another embodiment, processing system 110 operates the plurality of first sensor electrodes 205 and the plurality of second sensor electrodes 215 as absolute capacitive sensing electrodes.

The plurality of first sensor electrodes 205 and the plurality of second sensor electrodes 215 are typically ohmically isolated from each other. That is, one or more insulators separate the plurality of first sensor electrodes 205 and the plurality of second sensor electrodes 215 and prevent them from electrically shorting to each other. In some embodiments, the plurality of first sensor electrodes 205 and the plurality of second sensor electrodes 215 may be disposed on a common layer. The pluralities of sensor electrodes 205 and 215 may be electrically separated by insulative material disposed between them at cross-over areas; in such constructions, the plurality of first sensor electrodes 205 and/or the plurality of second sensor electrodes 215 may be formed with jumpers connecting different portions of the same electrode. In some embodiments, the plurality of first sensor electrodes 205 and the plurality of second sensor electrodes 215 are separated by one or more layers of insulative material. In some embodiments, the plurality of first sensor electrodes 205 and the plurality of second sensor electrodes 215 are separated by one or more substrates; for example, they may be disposed on opposite sides of the same substrate, or on different substrates that are laminated together.

The pluralities of first and second sensor electrodes 205 and 215 may be formed into any desired shapes. Moreover, the size and/or shape of the sensor electrodes 205 may be different than the size and/or shape of the sensor electrodes 215. Additionally, sensor electrodes 205 and 215 located on a same side of a substrate may have different shapes and/or sizes. In one embodiment, the plurality of first sensor electrodes 205 may be larger (e.g., having a larger surface area) than the plurality of second sensor electrodes 215, although this is not a requirement. In other embodiments, the pluralities of first and second sensor electrodes 205 and 215 may have a similar size and/or shape.

In one embodiment, the plurality of first sensor electrodes 205 extends substantially in a first direction while the plurality of second sensor electrodes 215 extends substantially in a second direction. For example, and as shown in FIG. 2, the plurality of first sensor electrodes 205 extends in one direction, while the plurality of second sensor electrodes 215 extends in a direction substantially orthogonal to the sensor electrodes 205. Other orientations are also possible (e.g., parallel or other relative orientations).

In some embodiments, both the pluralities of first and second sensor electrodes 205 and 215 are located outside of a plurality (or display stack) of layers that together form the display device 160. One example of a display stack may include layers such as a lens layer, a one or more polarizer layers, a color filter layer, one or more display electrode layers, a display material layer, a thin-film transistor (TFT) glass layer, and a backlight layer. However, other implementations of a display stack are possible. In other embodiments, one or both of the pluralities of first and second sensor electrodes 205 and 215 are located within the display stack, whether included as part of a display-related layer or a separate layer. For example, Vcom electrodes within a particular display electrode layer can be configured to perform both display updating and capacitive sensing.

Arrangement 300 of FIG. 3 illustrates a portion of a pattern of sensor electrodes configured to sense in sensing region 170, according to several embodiments. For clarity of illustration and description, FIG. 3 shows the sensor electrodes 120 in a pattern of simple rectangles and does not show other associated components. The exemplary pattern comprises an array of sensor electrodes $120_{X,Y}$ arranged in X columns and Y rows, wherein X and Y are positive integers, although one of X and Y may be zero. It is contemplated that the pattern of sensor electrodes 120 may have other configurations, such as polar arrays, repeating patterns, non-repeating patterns, a single row or column, or another suitable implementation. Further, in various embodiments the number of sensor electrodes 120 may vary from row to row and/or column to column. In one embodiment, at least one row and/or column of sensor electrodes 120 is offset from the others, such that it extends further in at least one direction than the others. The sensor electrodes 120 is coupled to the processing system 110 and utilized to determine the presence (or lack thereof) of an input object in the sensing region 170.

In a first sensing mode of operation, the arrangement of sensor electrodes 120 ($120_{1,1}$, $120_{2,1}$, $120_{3,1}$, . . . , $120_{X,Y}$) may be utilized to detect the presence of an input object via absolute sensing techniques. That is, processing system 110 is configured to modulate sensor electrodes 120 to acquire measurements of changes in capacitive coupling between the modulated sensor electrodes 120 and an input object to determine the position of the input object. Processing system 110 is further configured to determine changes of absolute capacitance based on a measurement of resulting signals received with sensor electrodes 120 which are modulated.

In some embodiments, the arrangement 300 includes one or more grid electrodes (not shown) that are disposed between at least two of the sensor electrodes 120. The grid electrode(s) may at least partially circumscribe the plurality of sensor electrodes 120 as a group, and may also, or in the alternative, completely or partially circumscribe one or more of the sensor electrodes 120. In one embodiment, the grid electrode is a planar body having a plurality of apertures, where each aperture circumscribes a respective one of the sensor electrodes 120. In other embodiments, the grid electrode(s) comprise a plurality of segments that may be driven individually or in groups or two or more segments. The grid electrode(s) may be fabricated similar to the sensor electrodes 120. The grid electrode(s), along with sensor electrodes 120, may be coupled to the processing system 110 utilizing conductive routing traces and used for input object detection.

The sensor electrodes 120 are typically ohmically isolated from each other, and are also ohmically isolated from the grid electrode(s). That is, one or more insulators separate the sensor electrodes 120 and grid electrode(s) and prevent them from electrically shorting to each other. In some embodiments, the sensor electrodes 120 and grid electrode(s) are separated by an insulative gap, which may be filled with an electrically insulating material, or may be an air gap. In some embodiments, the sensor electrodes 120 and the grid electrode(s) are vertically separated by one or more layers of insulative material. In some other embodiments, the sensor electrodes 120 and the grid electrode(s) are separated by one or more substrates; for example, they may be disposed on opposite sides of the same substrate, or on different substrates. In yet other embodiments, the grid electrode(s) may be composed of multiple layers on the same substrate, or on different substrates. In one embodiment, a first grid electrode may be formed on a first substrate (or a first side of a substrate) and a second grid electrode may be formed on a second substrate (or a second side of a substrate). For example, a first grid electrode comprises one or more common electrodes disposed on a thin-film transistor (TFT) layer of the display device 160 (FIG. 1) and a second grid electrode is disposed on the color filter glass of the display device 160. The dimensions of the first and second grid electrodes can be equal or differ in at least one dimension.

In a second sensing mode of operation, the sensor electrodes 120 ($120_{1,1}$, $120_{2,1}$, $120_{3,1}$, . . . , $120_{X,Y}$) may be utilized to detect the presence of an input object via transcapacitive sensing techniques when a transmitter signal is driven onto the grid electrode(s). That is, processing system 110 is configured to drive the grid electrode(s) with a transmitter signal and to receive resulting signals with each sensor electrode 120, where a resulting signal comprising effects corresponding to the transmitter signal, which is utilized by the processing system 110 or other processor to determine the position of the input object.

In a third sensing mode of operation, the sensor electrodes 120 may be split into groups of transmitter and receiver electrodes utilized to detect the presence of an input object via transcapacitive sensing techniques. That is, processing system 110 may drive a first group of sensor electrodes 120 with a transmitter signal and receive resulting signals with the second group of sensor electrodes 120, where a resulting signal comprises effects corresponding to the transmitter signal. The resulting signal is utilized by the processing system 110 or other processor to determine the position of the input object.

The input device 100 may be configured to operate in any one of the sensing modes described above. The input device 100 may also be configured to switch between any two or more of the sensing modes described above.

The areas of localized capacitive sensing of capacitive couplings may be termed "capacitive pixels," "touch pixels," "tixels," etc. Capacitive pixels may be formed between an individual sensor electrode 120 and a reference voltage in the first sensing mode of operation, between the sensor electrodes 120 and grid electrode(s) in the second sensing mode of operation, and between groups of sensor electrodes 120 used as transmitter and receiver electrodes (e.g., arrangement 200 of FIG. 2). The capacitive coupling changes with the proximity and motion of input objects in the sensing region 170 associated with the sensor electrodes 120, and thus may be used as an indicator of the presence of the input object in the sensing region of the input device 100.

In some embodiments, the sensor electrodes 120 are "scanned" to determine these capacitive couplings. That is, in one embodiment, one or more of the sensor electrodes 120 are driven to transmit transmitter signals. Transmitters may be operated such that one transmitter electrode transmits at one time, or such that multiple transmitter electrodes transmit at the same time. Where multiple transmitter electrodes transmit simultaneously, the multiple transmitter electrodes may transmit the same transmitter signal and thereby produce an effectively larger transmitter electrode. Alternatively, the multiple transmitter electrodes may transmit different transmitter signals. For example, multiple transmitter electrodes may transmit different transmitter signals according to one or more coding schemes that enable their combined effects on the resulting signals of receiver electrodes to be independently determined. In one embodiment, multiple transmitter electrodes may simultaneously transmit the same transmitter signal while the receiver electrodes receive the effects and are measured according to a scanning scheme.

The sensor electrodes 120 configured as receiver sensor electrodes may be operated singly or multiply to acquire resulting signals. The resulting signals may be used to determine measurements of the capacitive couplings at the capacitive pixels. Processing system 110 may be configured to receive with the sensor electrodes 120 in a scanning fashion and/or a multiplexed fashion to reduce the number of simultaneous measurements to be made, as well as the size of the supporting electrical structures. In one embodiment, one or more sensor electrodes are coupled to a receiver of processing system 110 via a switching element such as a multiplexer or the like. In such an embodiment, the switching element may be internal to processing system 110 or external to processing system 110. In one or more embodiments, the switching elements may be further configured to couple a sensor electrode 120 with a transmitter or other signal and/or voltage potential. In one embodiment, the switching element may be configured to couple more than one receiver electrode to a common receiver at the same time.

In other embodiments, "scanning" sensor electrodes 120 to determine these capacitive couplings comprises modulating one or more of the sensor electrodes and measuring an absolute capacitance of the one or more sensor electrodes. In another embodiment, the sensor electrodes may be operated such that more than one sensor electrode is driven and received with at a time. In such embodiments, an absolute capacitive measurement may be obtained from each of the one or more sensor electrodes 120 simultaneously. In one embodiment, each of the sensor electrodes 120 are simultaneously driven and received with, obtaining an absolute capacitive measurement simultaneously from each of the sensor electrodes 120. In various embodiments, processing system 110 may be configured to selectively modulate a portion of sensor electrodes 120. For example, the sensor electrodes may be selected based on, but not limited to, an application running on the host processor, a status of the input device, and an operating mode of the sensing device. In various embodiments, processing system 110 may be configured to selectively shield at least a portion of sensor electrodes 120 and to selectively shield or transmit with the grid electrode(s) while selectively receiving and/or transmitting with other sensor electrodes 120.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

In any of the above embodiments, multiple sensor electrodes 120 may be ganged together such that the sensor electrodes 120 are simultaneously modulated or simultaneously received with. As compared to the methods described above, ganging together multiple sensor electrodes may produce a coarse capacitive image that may not be usable to discern precise positional information. However, a coarse capacitive image may be used to sense presence of an input object. In one embodiment, the coarse capacitive image may be used to move processing system 110 or the input device 100 out of a doze mode or low-power mode (also referred to herein as a "first mode") and into an active mode or high-power mode (also referred to herein as a "second mode"). The doze mode may refer to a mode in which the input device 100 or processing system 110 conserves power and uses an absolute capacitive sensing technique to detect the proximity of an input object to the sensing region (i.e., to perform presence detection). In contrast, the active mode may refer to a mode in which the input device 100 or processing system 110 consumes a greater amount of power and uses an absolute capacitive sensing technique and/or transcapacitive sensing technique to determine, for example, the location of an input object in the sensing region. In one embodiment, the coarse capacitive image may be used to move a capacitive sensing IC out of the doze mode and into the active mode. In another embodiment, the coarse capacitive image may be used to move at least one of a host IC and a display driver out of the doze mode and into the active mode. The coarse capacitive image may correspond to the entire sensor area or only to a portion of the sensor area.

The background capacitance of the input device 100 is the capacitive image associated with no input object in the sensing region 170. The background capacitance changes with the environment and operating conditions, and may be estimated in various ways. For example, some embodiments take "baseline images" when no input object is determined to be in the sensing region 170, and use those baseline images as estimates of their background capacitances. The background capacitance or the baseline capacitance may be present due to stray capacitive coupling between two sensor electrodes, where one sensor electrode is driven with a modulated signal and the other is held stationary relative to system ground, or due to stray capacitive coupling between a receiver electrode and nearby modulated electrodes. In many embodiments, the background or baseline capacitance may be relatively stationary over the time period of a user input gesture.

Capacitive images can be adjusted for the background capacitance of the input device 100 for more efficient processing. Some embodiments accomplish this by "baselining" measurements of the capacitive couplings at the capacitive pixels to produce a "baselined capacitive image." That is, some embodiments compare the measurements forming a capacitance image with appropriate "baseline values" of a "baseline image" associated with those pixels, and determine changes from that baseline image.

In some touch screen embodiments, one or more of the sensor electrodes 120 comprise one or more display electrodes used in updating the display of the display screen. The display electrodes may comprise one or more elements of the active matrix display such as one or more segments of a segmented Vcom electrode (common electrode(s)), a source drive line, gate line, an anode sub-pixel electrode or cathode pixel electrode, or any other suitable display element. These display electrodes may be disposed on an appropriate display screen substrate. For example, the common electrodes may be disposed on a transparent substrate (a glass substrate, TFT glass, or any other transparent material) in some display screens (e.g., In-Plane Switching (IPS), Fringe Field Switching (FFS) or Plane to Line Switching (PLS) Organic Light Emitting Diode (OLED)), on the bottom of the color filter glass of some display screens (e.g., Patterned Vertical Alignment (PVA) or Multi-domain Vertical Alignment (MVA)), over an emissive layer (OLED), etc. In such embodiments, the display electrode can also be referred to as a "combination electrode," since it performs multiple functions. In various embodiments, each of the sensor electrodes 120 comprises one or more common electrodes. In other embodiments, at least two sensor electrodes 120 may share at least one common electrode. While the following description may describe that sensor electrodes 120 and/or grid electrode(s) comprise one or more common electrodes, various other display electrodes as described above may also be used in conjunction with the common electrode or as an alternative to the common electrodes. In various embodiments, the sensor electrodes 120 and grid electrode(s) comprise the entire common electrode layer (Vcom electrode).

In various touch screen embodiments, the "capacitive frame rate" (the rate at which successive capacitive images are acquired) may be the same or be different from that of the "display frame rate" (the rate at which the display image is updated, including refreshing the screen to redisplay the same image). In various embodiments, the capacitive frame rate is an integer multiple of the display frame rate. In other embodiments, the capacitive frame rate is a fractional multiple of the display frame rate. In yet further embodiments, the capacitive frame rate may be any fraction or integer multiple of the display frame rate. In one or more embodiments, the display frame rate may change (e.g., to reduce power or to provide additional image data such as a three-dimensional (3D) display information) while touch frame rate maintains constant. In other embodiments, the display frame rate may remain constant while the touch frame rate is increased or decreased.

Continuing to refer to FIG. 3, the processing system 110 coupled to the sensor electrodes 120 includes a sensor module 310 and optionally, a display driver module 320. The sensor module 310 includes circuitry configured to drive at least one of the sensor electrodes 120 for capacitive sensing during periods in which input sensing is desired. In one embodiment, the sensor module 310 is configured to drive a modulated signal onto the at least one sensor electrode 120 to detect changes in absolute capacitance between the at least one sensor electrode and an input object. In another embodiment, the sensor module 310 is configured to drive a transmitter signal onto the at least one sensor electrode 120 to detect changes in a transcapacitance between the at least one sensor electrode and another sensor electrode 120. The modulated and transmitter signals are generally varying voltage signals comprising a plurality of voltage transitions over a period of time allocated for input sensing. In various embodiments, the sensor electrodes 120 and/or grid electrode(s) may be driven differently in different modes of operation. In one embodiment, the sensor electrodes 120 and/or grid electrode(s) may be driven with signals (modulated signals, transmitter signals and/or shield signals) that may differ in any one of phase, amplitude, and/or shape. The amplitude of a signal may refer to an instantaneous value or a departure from an average value of the signal. In various embodiments, the modulated signal and transmitter signal are similar in at least one shape, frequency, amplitude, and/or phase. In other embodiments, the modulated signal and the transmitter signals are different in frequency, shape, amplitude, and phase. The sensor module 310 may be selectively coupled to one or more of the sensor electrodes 120 and/or the grid electrode(s). For example, the sensor module 310 may be coupled to selected portions of the sensor electrodes 120 and operate in either an absolute or transcapacitive sensing mode. In another example, the sensor module 310 may be a different portion of the sensor electrodes 120 and operate in either an absolute or transcapacitive sensing mode. In yet another example, the sensor module 310 may be coupled to all the sensor electrodes 120 and operate in either an absolute or transcapacitive sensing mode.

The sensor module 310 is configured to operate the grid electrode(s) as a shield electrode that may shield sensor electrodes 120 from the electrical effects of nearby conductors. In one embodiment, the processing system is configured to operate the grid electrode(s) as a shield electrode that may "shield" sensor electrodes 120 from the electrical effects of nearby conductors, and to guard the sensor electrodes 120 from grid electrode(s), at least partially reducing the parasitic capacitance between the grid electrode(s) and the sensor electrodes 120. In one embodiment, a shielding signal is driven onto the grid electrode(s). The shielding signal may be a ground signal, such as the system ground or other ground, or any other constant voltage (i.e., non-modulated) signal. In another embodiment, operating the grid electrode(s) as a shield electrode may comprise electrically floating the grid electrode. In one embodiment, grid electrode(s) are able to operate as an effective shield electrode while being electrically floated due to their large coupling to the other sensor electrodes. In other embodiments, the shielding signal may be referred to as a "guarding signal" where the guarding signal is a varying voltage signal having at least one of a similar phase, frequency, and amplitude as the modulated signal driven onto the sensor electrodes. In one or more embodiments, routing traces may be shielded from responding to an input object due to routing beneath the grid electrode(s) and/or sensor electrodes 120, and therefore may not be part of the active sensor electrodes, shown as sensor electrodes 120.

In one or more embodiments, capacitive sensing (or input sensing) and display updating may occur during at least partially overlapping periods. For example, as a common electrode is driven for display updating, the common electrode may also be driven for capacitive sensing. In another embodiment, capacitive sensing and display updating may occur during non-overlapping periods, also referred to as non-display update periods. In various embodiments, the non-display update periods may occur between display line update periods for two display lines of a display frame and may be at least as long in time as the display update period. In such embodiments, the non-display update period may be referred to as a "long horizontal blanking period," "long h-blanking period" or a "distributed blanking period," where the blanking period occurs between two display updating periods and is at least as long as a display update period. In one embodiment, the non-display update period occurs between display line update periods of a frame and is long enough to allow for multiple transitions of the transmitter signal to be driven onto the sensor electrodes 120. In other embodiments, the non-display update period may comprise horizontal blanking periods and vertical blanking periods. Processing system 110 may be configured to drive sensor electrodes 120 for capacitive sensing during any one or more of or any combination of the different non-display update times. Synchronization signals may be shared between sensor module 310 and display driver module 320 to provide accurate control of overlapping display updating and capacitive sensing periods with repeatably coherent frequencies and phases. In one embodiment, these synchronization signals may be configured to allow the relatively stable voltages at the beginning and end of the input sensing period to coincide with display update periods with relatively stable voltages (e.g., near the end of an input integrator reset time and near the end of a display charge share time). A modulation frequency of a modulated or transmitter signal may be at a harmonic of the display line update rate, where the phase is determined to provide a nearly constant charge coupling from the display elements to the receiver electrode, allowing this coupling to be part of the baseline image.

The sensor module 310 includes circuitry configured to receive resulting signals with the sensor electrodes 120 and/or grid electrode(s) comprising effects corresponding to the modulated signals or the transmitter signals during periods in which input sensing is desired. The sensor module 310 may determine a position of the input object in the sensing region 170 or may provide a signal including information indicative of the resulting signal to another module or processor, for example, a determination module or a processor of an associated electronic system 150 (i.e., a host processor), for determining the position of the input object in the sensing region 170.

The display driver module 320 may be included in or separate from the processing system 110. The display driver module 320 includes circuitry configured to provide display image update information to the display of the display device 160 during non-sensing (e.g., display updating) periods.

In one embodiment, the processing system 110 comprises a first integrated controller comprising the display driver module 320 and at least a portion of the sensor module 310 (i.e., transmitter module and/or receiver module). In another embodiment, the processing system 110 comprises a first integrated controller comprising the display driver module 320 and a second integrated controller comprising the sensor module 310. In yet another embodiment, the processing system comprises a first integrated controller comprising display driver module 320 and a first portion of the sensor module 310 (e.g., one of a transmitter module and a receiver module) and a second integrated controller comprising a second portion of the sensor module 310 (e.g., the other one of the transmitter and receiver modules). In those embodiments comprising multiple integrated circuits, a synchronization mechanism may be coupled between them, configured to synchronize display updating periods, sensing periods, transmitter signals, display update signals, and the like.

Figure 4A:
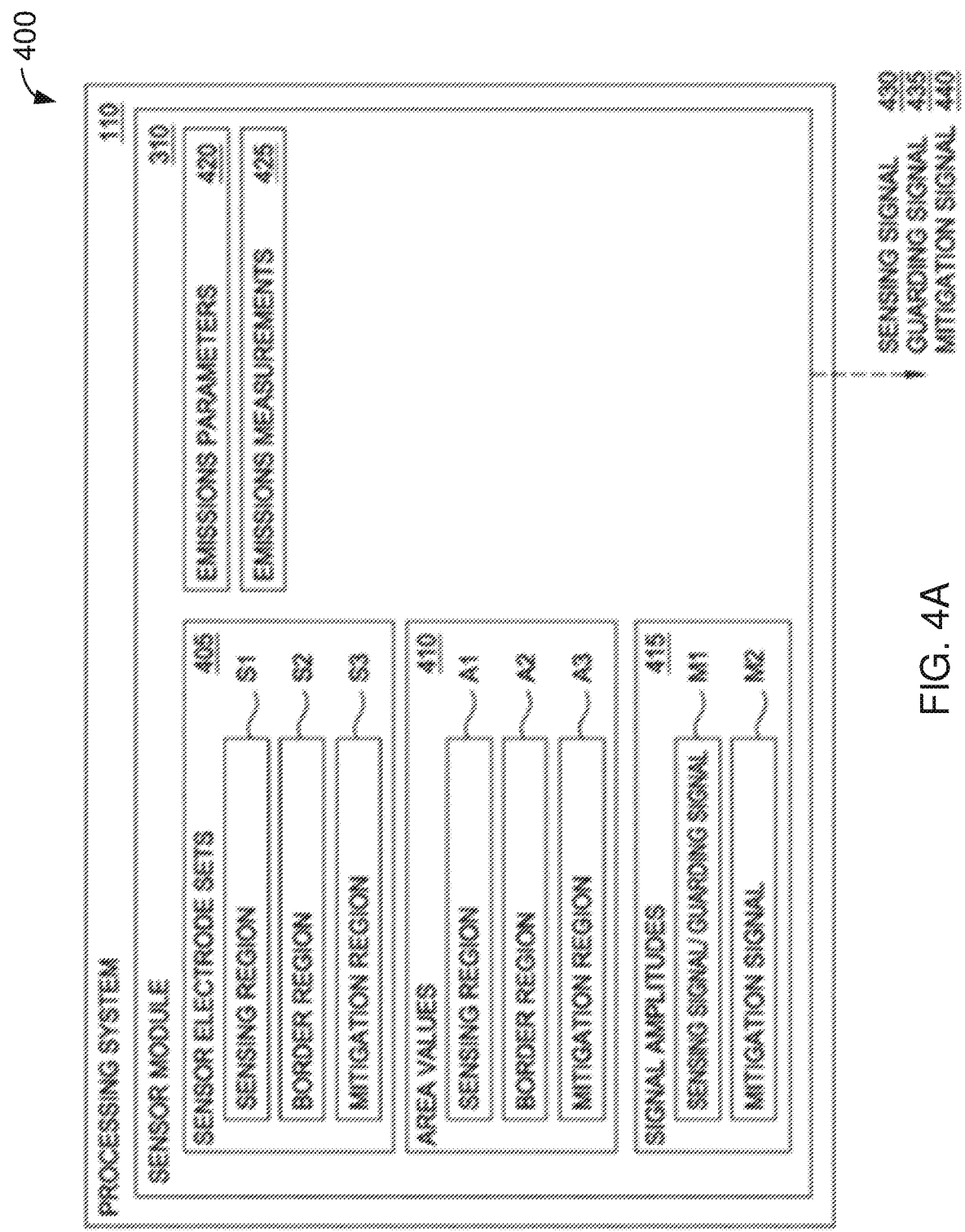
FIG. 4A illustrates an exemplary processing system for active reduction of electromagnetic emissions, according to embodiments described herein.

FIG. 4A illustrates an exemplary processing system for active reduction of electromagnetic emissions, according to embodiments described herein. More specifically, arrangement 400 provides one possible implementation of the processing system 110 discussed above. Further, the arrangement 400 is capable of use in conjunction with various embodiments discussed herein, such as the arrangements 200 and 300 of sensor electrodes discussed above with respect to FIGS. 2 and 3.

Within arrangement 400, the sensor module 310 is configured to determine a plurality of sensor electrode sets 405. The plurality of sensor electrode sets 405 may be predetermined, dynamically determined, and/or dynamically updated. In some embodiments, sensor electrodes of a first set S1 form a sensing region, sensor electrodes of a second set S2 form a border region, and sensor electrodes of a third set S3 form a mitigation region. Sensor electrodes of the first set S1 may be driven with a sensing signal 430, sensor electrodes of the second set S2 may be driven with a guarding signal 435, and sensor electrodes of the third set S3 may be driven with a mitigation signal 440. In some alternate embodiments, the sensor electrodes of the third set S3 may be replaced by dedicated mitigation electrodes that are used for EM emissions mitigation and not included in capacitive measurements acquired by the sensor module 310. The dedicated mitigation electrodes may be included in a same layer as the sensor electrodes or in a different layer than the sensor electrodes. For example, the dedicated mitigation electrodes may be formed of the same conductive material(s) as the sensor electrodes (e.g., a substantially transparent material such as indium tin oxide (ITO), transparent conductive oxides (TCOs), carbon nanotube thin films, nanowire meshes, and so forth), or formed of different conductive material(s) such as non-transparent metal traces. In some cases, the dedicated mitigation electrodes may be visually obscured, e.g., disposed beneath a black mask layer that surrounds a visible portion of a display device. In these cases, one or more sensor electrodes of the second set S2 (that is, of the border region) may also be visually obscured. In some alternate embodiments, the sensor electrodes of the second set S2 may also be replaced by dedicated mitigation electrodes that are not included in capacitive measurements.

In some embodiments, the sensor module 310 is configured to perform a scan of the plurality of sensor electrodes (e.g., acquiring capacitive measurements corresponding to a full sensing frame) by updating the first set S1 of sensor electrodes during one or more sensing periods. In one non-limiting example, the first set S1 corresponds to half of a first axis during a first period, and the other half of the first axis during a second period. Other fractional portions are also possible and may include non-overlapping or overlapping portions. The first set S1 may further correspond to half of a second axis during a third period, and the other half of the second axis during a fourth period. In some embodiments, the second axis is substantially orthogonal to the first axis. In this way, the sensor module 310 may be configured to sequentially perform capacitive sensing for an entire axis for one or more axes.

The properties of the sensing signal 430, the guarding signal 435, and/or the mitigation signal 440 may be selected to perform an active reduction of EM emissions caused at least partly by driving the sensing signal 430 onto the first set S1 of sensor electrodes. The sensing signal 430 may be a time-varying voltage signal (i.e., a modulated signal)

having a first polarity. The guarding signal 435 generally has a similar phase, frequency, and/or amplitude as the sensing signal 430. In some embodiments, the guarding signal 435 is substantially the same as the sensing signal 430. Based on the selected properties, the guarding signal 435 and the sensing signal 430 may have substantially a same first polarity. In some embodiments, the mitigation signal 440 has a second polarity opposite to the first polarity. For example, the mitigation signal 440 may be based on an inverted copy of the sensing signal 430. As used herein, a "mitigation signal" may be any signal that is opposite in polarity (e.g., inverted), cancels, reduces, or otherwise mitigates the radiation of the sensing signal and/or the guarding signal.

Figure 4B:
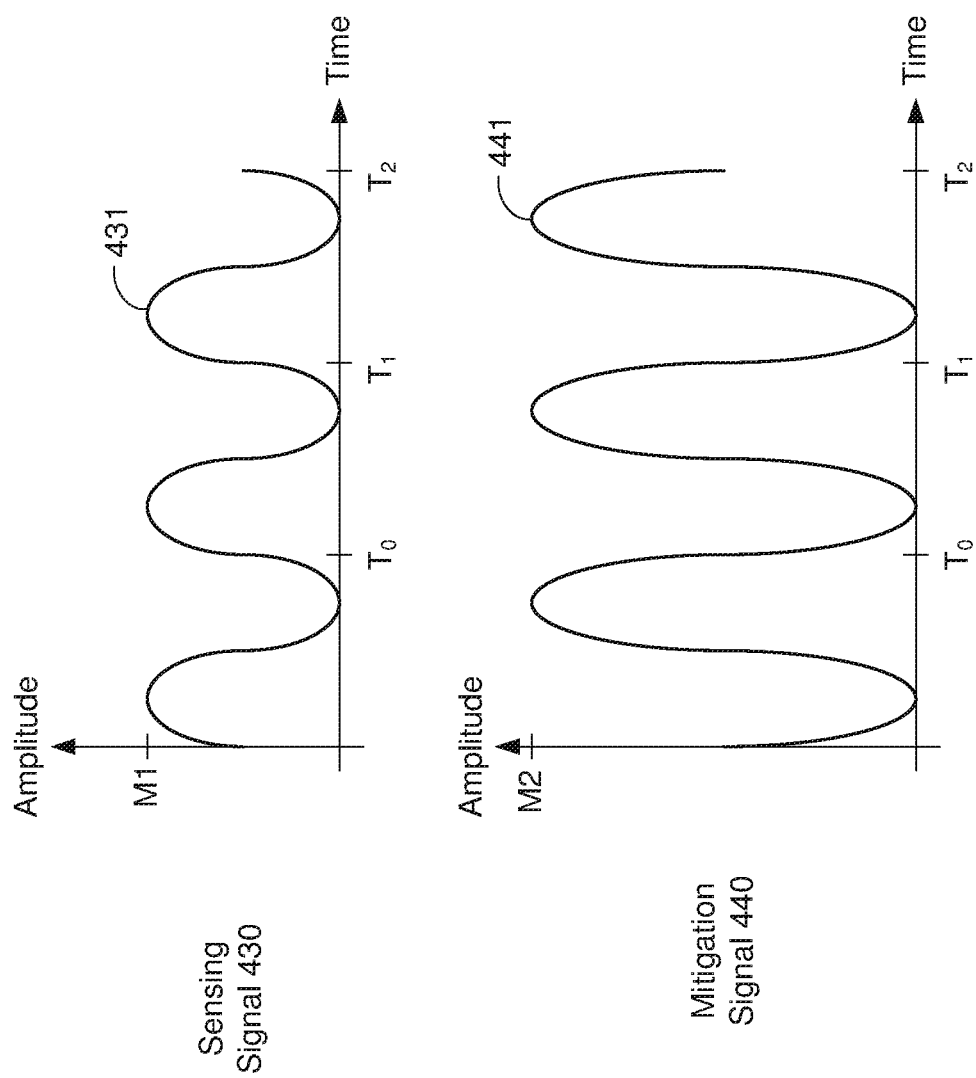
FIG. 4B is a diagram illustrating exemplary sensing and mitigation signals, according to embodiments described herein.

FIG. 4B shows a diagram 450 illustrating exemplary sensing and mitigation signals, according to embodiments described herein. The sensing signal 430 is shown as waveform 431 having an amplitude M1 and the mitigation signal 440 is shown as waveform 441 having an amplitude M2. Although illustrated as sine waveforms to ease explanation, the sensing signal 430 and the mitigation signal 440 may be any feasible signals. As shown in FIG. 4B, the mitigation signal 440 may be based on an inverted sensing signal 430.

The sensor module 310 is configured to determine one or more of a plurality of signal amplitudes 415 for generating the sensing signal 430, the guarding signal 435, and/or the mitigation signal 440. In some embodiments, the guarding signal 435 and the sensing signal 430 have the same amplitude M1. The amplitude M2 of the mitigation signal 440 may be selected to provide a desired mitigation of EM emissions resulting from driving the sensing signal 430 and the guarding signal 435, which in some cases is selected based at least partly on the amplitude M1. Thus, as shown in FIG. 4B, the amplitude M1 may be different from the amplitude M2. Although not explicitly discussed, in alternate embodiments different mitigation signals may be driven onto different sensor electrodes of the second set S2 (e.g., having different amplitude values).

In some embodiments, the amplitude M2 may be further based on at least one of: a number of sensor electrodes included in the first set S1, an area formed by the first set S1, a number of sensor electrodes included in the second set S2, an area formed by the second set S2, a number of sensor electrodes included in the third set S3, and an area formed by the third set S3 (or alternately, an area formed by a plurality of dedicated mitigation electrodes). In one example, a first region includes the sensing region formed by the first set S1 and the border region formed by the second set S2, and a second region includes the mitigation region formed by the third set S3. As discussed herein, the first region comprises a "substantially contiguous" region in which substantially all of the sensor electrodes included therein are driven with signal(s) having a same polarity. A substantially contiguous region may include non-sensing areas, such as insulative areas between different sensor electrodes. Although substantially all of the sensor electrodes of the substantially contiguous region are driven with same polarity signal(s), in some cases the substantially contiguous region may include one or more other sensor electrodes that are driven with different signals (e.g., a direct current signal or an alternating current signal with another polarity), grounded, electrically floated, etc. In such cases, the one or more other sensor electrodes should comprise only a relatively small portion of the region, such as 10% of the region or less. In some cases, the substantially contiguous first region corresponds to a first area that is greater than a second area corresponding to the second region. In some embodiments, to suitably mitigate the EM emissions from driving the sensor electrodes within the (larger) substantially contiguous first region, the amplitude M2 may be selected to be greater than the amplitude M1, as shown in FIG. 4B. In some other embodiments, the amplitude M2 may be equal to or smaller than the amplitude M1.

In some embodiments, the sensor module 310 is configured to determine one or more of a plurality of area values 410. In some embodiments, a first area A1 corresponds to the sensing region (formed by the first set S1), a second area A2 corresponds to the border region (formed by the second set S2), and a third area A3 corresponds to the mitigation region (formed by the third set S3). The sensor module 310 may determine the first area (corresponding to the substantially contiguous first region) based on the first area A1 and the second area A2, and/or may determine the second region based on the third area A3. In some cases, the sensor module 310 is configured to select the sensor electrodes for the one or more of the first set S1, the second set S2, and the third set S3 based on a desired value for the first area A1, the second area A2, and/or the third area A3.

In some embodiments, the sensor module 310 is configured to determine the properties of one or more of the generated signals and/or the plurality of sensor electrode sets 405 based on one or more emissions parameters 420. For example, the emissions parameters 420 may include broadband emission limits and/or narrowband emission limits that are included in prescribed standards. Some non-limiting examples of governing regulations providing prescribed standards for the automotive market include UNECE Regulation 10, SAE J1113 series, and CISPR 25. The emissions parameters 420 may be defined in power units such as milliwatts (mW) or decibel-milliwatts (dBm), in field strength units such as decibel-microvolts (dBuV), or any alternate suitable units. The sensor module 310 may further include one or more emissions measurements 425. In one embodiment, the sensor module 310 is communicatively coupled with an antenna (e.g., arranged at a prescribed distance from the radiating sensor electrodes) and acquires the emissions measurements 425 using the antenna (not shown). In another embodiment, the sensor module 310 is communicatively coupled with a test apparatus and receives the emissions measurements 425 from the test apparatus (not shown).

The sensing module 310 is further configured to adjust, based on the emissions measurements 425, properties of one or more of the generated signals and/or the plurality of sensor electrode sets 405. For example, if the one or more emissions measurements 425 indicate that emission limit(s) included in the one or more emissions parameters 420 are being exceeded, the sensing module 310 may be configured to perform at least one of: (1) changing a composition and/or size of first set S1 and/or second set S2, (2) changing a composition and/or size of the third set S3, (3) changing (e.g., increasing or decreasing) the amplitude M1, or (4) changing the amplitude M2 of the mitigation signal 440. In other words, the sensing module 310 may adjust one or more of the aforementioned parameters until the excess emissions are minimized and/or until the emissions measurements 425 are below (or at least equal to) the emission limit(s).

Figure 5:
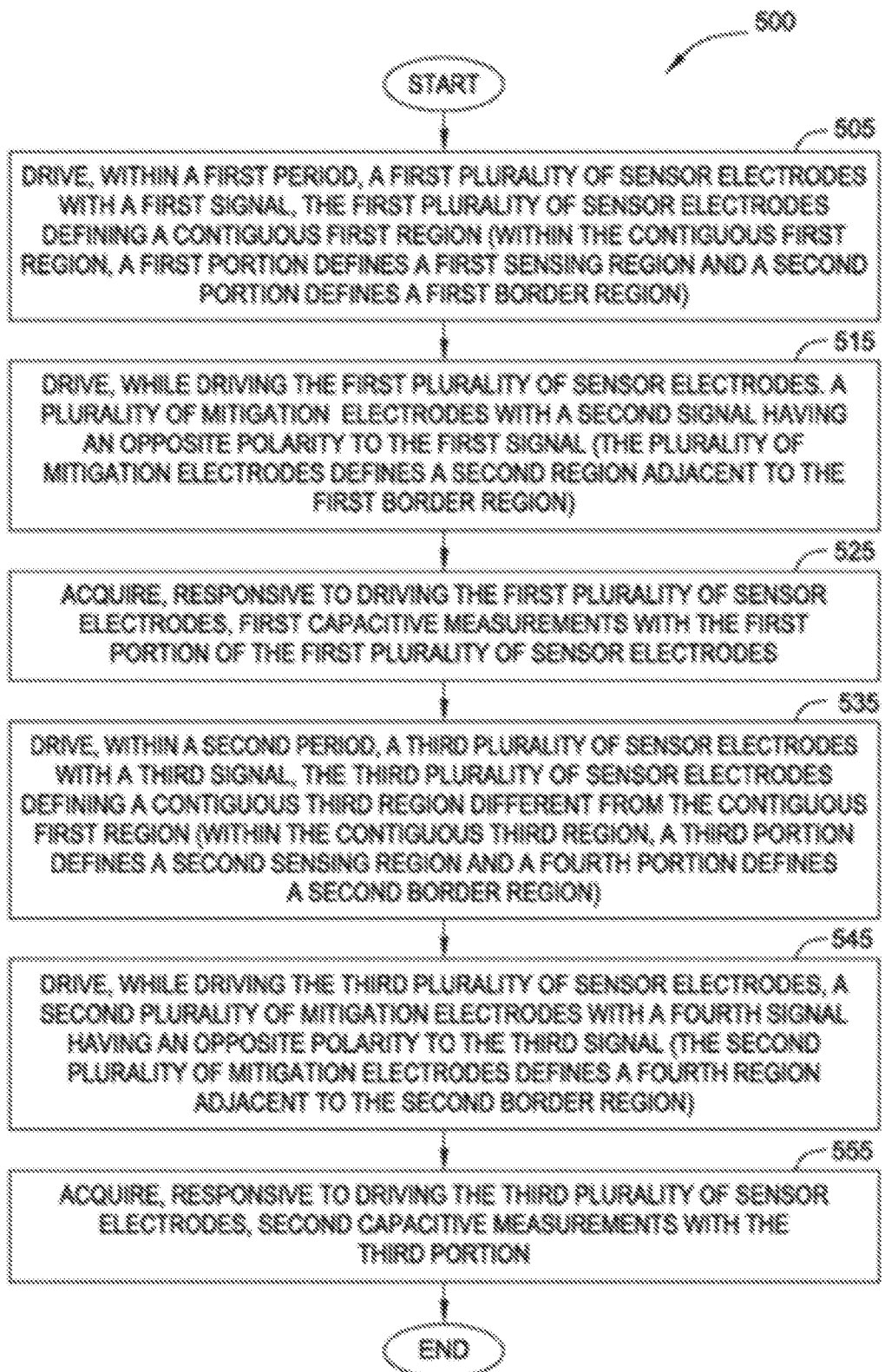
FIG. 5 illustrates a method of performing an active reduction of electromagnetic emissions, according to embodiments described herein.

FIG. 5 illustrates a method 500 of performing an active reduction of electromagnetic emissions, according to embodiments described herein. Method 500 may be performed in conjunction with other embodiments, such as the processing system of arrangement 400 of FIG. 4A. More specifically, method 500 may be performed during operation of the sensor module 310 of the arrangement 400.

Method 500 begins at block 505, where the sensor module drives, within a first period, a plurality of first sensor electrodes with a first signal. The plurality of first sensor electrodes may form a substantially contiguous first region. Within the substantially contiguous first region, a first portion of the plurality of first sensor electrodes forms a first sensing region, and a second portion of the plurality of first sensor electrodes forms a first border region.

At block 515, the sensor module drives, while driving the plurality of first sensor electrodes, a plurality of mitigation electrodes with a second signal having an opposite polarity to the first signal. The plurality of mitigation electrodes forms a second region that is adjacent to the first border region. In some embodiments, the plurality of mitigation electrodes are dedicated mitigation electrodes that are not included in acquired capacitive measurements.

At block 525, the sensor module acquires, responsive to driving the plurality of first sensor electrodes, first capacitive measurements with the first portion of the plurality of first sensor electrodes. The first capacitive measurements correspond to the first sensing region. The first capacitive measurements may reflect absolute capacitive measurements and/or mutual capacitive measurements acquired using the first portion of the plurality of first sensor electrodes. In some embodiments, the second portion of the plurality of first sensor electrodes are operated as guarding electrodes for the first portion of the plurality of first sensor electrodes, and the first capacitive measurements do not include the second portion of the plurality of first sensor electrodes.

At block 535, the sensor module drives, within a second period, a plurality of third sensor electrodes with a third signal. The plurality of third sensor electrodes may form a substantially contiguous third region that is different from the substantially contiguous first region. Within the substantially contiguous third region, a third portion of the plurality of third sensor electrodes forms a second sensing region and a fourth portion of the plurality of third sensor electrodes forms a second border region.

At block 545, the sensor module drives, while driving the plurality of third sensor electrodes, a plurality of second mitigation electrodes with a fourth signal having an opposite polarity to the third signal. The plurality of second mitigation electrodes forms a fourth region adjacent to the second border region. The plurality of second mitigation electrodes may comprise dedicated mitigation electrodes that are not included in acquired capacitive measurements, or may comprise a plurality of fourth sensor electrodes.

At block 555, the sensor module acquires, responsive to driving the plurality of third sensor electrodes, second capacitive measurements with the third portion. In some embodiments, the first capacitive measurements and the second capacitive measurements can be used to perform a complete scan of the plurality of sensor electrodes arranged along one or more axes. Method 500 ends following completion of block 555.

Figure 6:
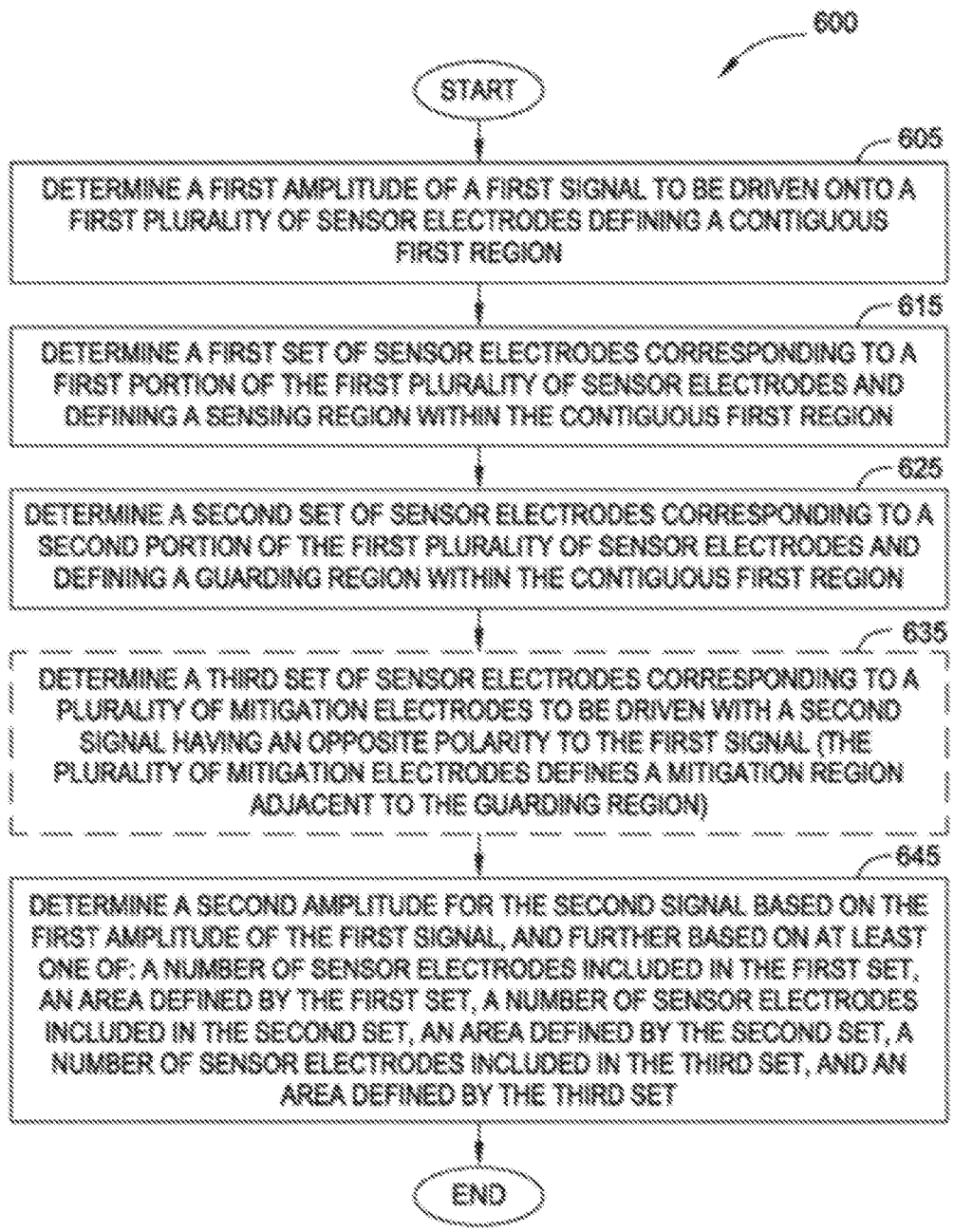
FIG. 6 illustrates a method of determining parameters for performing active reduction of electromagnetic emissions, according to embodiments described herein.

FIG. 6 illustrates a method 600 of determining parameters for performing active reduction of EM emissions, according to embodiments described herein. The method 600 may be performed in conjunction with other embodiments, such as the processing system of arrangement 400 of FIG. 4A and/or the method 500 of FIG. 5. More specifically, the method 600 may be performed as part of the sensor module initially determining and/or updating a capacitive sensing configuration.

Method 600 begins at block 605, where the sensor module determines a first amplitude of a first signal to be driven onto a plurality of first sensor electrodes forming a substantially contiguous first region. In some embodiments, the first amplitude is a predetermined value.

At block 615, the sensor module determines a first set of sensor electrodes corresponding to a first portion of the plurality of first sensor electrodes. The first portion of the plurality of first sensor electrodes forms a sensing region within the substantially contiguous first region. At block 625, the sensor module determines a second set of sensor electrodes corresponding to a second portion of the plurality of first sensor electrodes. The second portion of the plurality of first sensor electrodes forms a guarding region within the substantially contiguous first region. At block 635, the sensor module determines a third set of sensor electrodes corresponding to a plurality of mitigation electrodes to be driven with a second signal that has an opposite polarity to the first signal. The plurality of mitigation electrodes forms a mitigation region adjacent to the guarding region. In some alternate embodiments, the plurality of mitigation electrodes comprises dedicated mitigation electrodes that are not included in acquired capacitive measurements.

At block 645, the sensor module determines a second amplitude for the second signal based on the first amplitude of the first signal. The second amplitude is further based on at least one of: a number of sensor electrodes included in the first set, an area formed by the first set, a number of sensor electrodes included in the second set, an area formed by the second set, a number of sensor electrodes included in the third set, and an area formed by the third set. In some alternate embodiments having dedicated mitigation electrodes, the second amplitude may be based on an area formed by the dedicated mitigation electrodes. Method 600 ends following completion of block 645. Although the blocks 605-645 have been depicted with a particular sequence, individual blocks may be performed with any other suitable ordering. Additionally, the blocks 605-645 may be performed during non-overlapping periods, or two or more individual blocks may be performed during overlapping periods.

Figure 7:
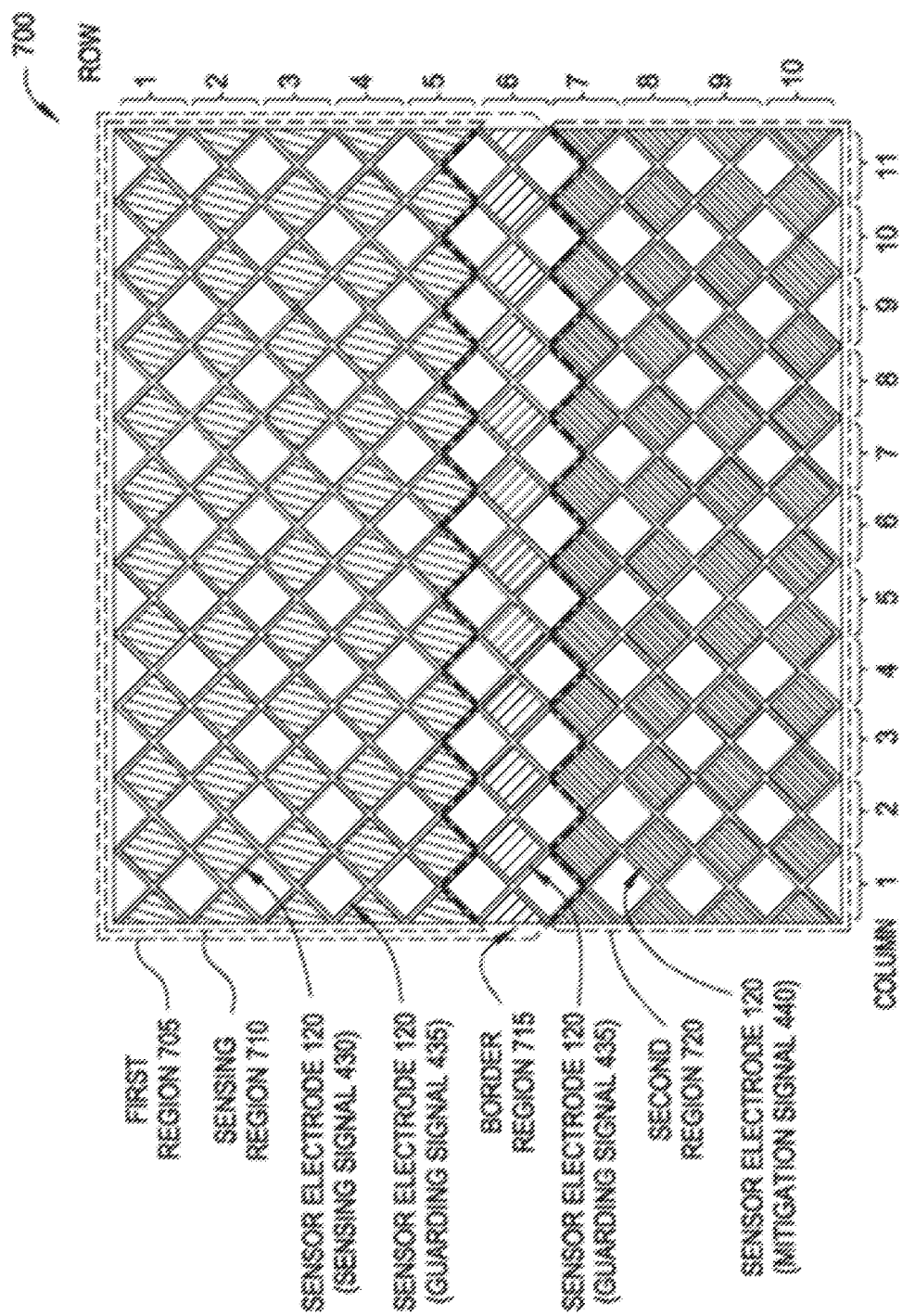
FIG. 7 is a diagram illustrating an exemplary arrangement of sensor electrodes for performing active reduction of electromagnetic emissions, according to embodiments described herein.

FIG. 7 is a diagram illustrating an exemplary arrangement 700 of sensor electrodes for performing active reduction of electromagnetic emissions, according to embodiments described herein. Sensor electrodes that are depicted in the arrangement 700 may be operated in conjunction with other embodiments, such as using the processing system of arrangement 400 of FIG. 4A and/or the method 500 of FIG. 5.

As shown, the plurality of sensor electrodes depicted in arrangement 700 are arranged in repeating grid pattern forming a plurality of ten (10) rows and a plurality of eleven (11) columns, although other sizes are also possible. Although the plurality of sensor electrodes have same-sized diamond shapes in arrangement 700, other sensor electrode shapes and/or sizes are also feasible. Some non-limiting examples of sensor electrode shapes include rectangular shapes and hexagonal shapes. Further, the sensor electrodes that are included in the plurality of rows are distinct from the sensor electrodes that are included in the plurality of columns, although this is not a requirement.

In arrangement 700, each sensor electrode that is included in a particular row or a particular column is electrically connected, such that desired signals can be driven onto each individual row and onto each individual column during operation. However, other implementations may include individually driven sensor electrodes or different groupings of sensor electrodes.

As shown, sensor electrodes 120 that are included in Rows 1-5 may be driven with the sensing signal 430, sensor electrodes 120 in Rows 7-10 may be driven with a mitigation signal 440, and sensor electrodes 120 included in Row 6 may be driven with a guarding signal 435. In some embodiments, the sensing signal 430 and the guarding signal 435 are the same, but sensor electrodes 120 that are driven with the guarding signal 435 are not included in capacitive measurements. The sensor electrodes 120 that are included in Columns 1-11 may be driven with the guarding signal 435.

A substantially contiguous first region 705 is formed by a plurality of first sensor electrodes 120 that are driven with the sensing signal 430 or with the guarding signal 435. As shown, the contiguous first region 705 comprises the sensor electrodes 120 included in Rows 1-6. In some embodiments, the contiguous region 705 may further comprise the sensor electrodes 120 of Columns 1-11 that are disposed from above Row 1 to between Row 6 and Row 7.

A second region 720 is formed by a plurality of second sensor electrodes 120 that are driven with the mitigation signal 440. As shown, the second region 720 comprises the sensor electrodes 120 included in Rows 7-10. In some embodiments, the second region 720 may further comprise the sensor electrodes 120 driven with the guarding signal 435 that are included in Columns 1-11 that are disposed from between Row 7 and Row 8 to below Row 10.

Within the first region 705, a sensing region 710 is formed by the sensor electrodes 120 that are driven with the sensing signal 430. As shown, the sensing region 710 extends to include the sensor electrodes 120 of Rows 1-5. Further, the sensor electrodes 120 driven with the sensing signal 430 (a first portion) and the sensor electrodes 120 driven with the guarding signal 435 (a third portion) are arranged in an alternating pattern within the sensing region 710.

A border region 715 is formed within the contiguous first region 705, and is disposed adjacent to the second region 720. The sensor electrodes 120 disposed within the border region 715 may be configured to guard the sensing region 120 from the effects of the mitigation signal 440 driven onto the sensor electrodes of the second region 120. In some embodiments, the size of the border region 715 may be determined based on the relative sizes of the sensing region 710 and/or the second region 720, and/or the relative amplitudes of the sensing signal 430 and/or the mitigation signal 440.

Described another way, in some embodiments, during a first period, a first portion (or subset) of a plurality of first sensor electrodes (i.e., forming the sensing region 710) includes at least a first row of the plurality of rows. A second portion (or subset) of the plurality of first sensor electrodes (i.e., forming the border region 715) includes at least a second row of the plurality of rows. A plurality of mitigation (or sensor) electrodes (i.e., forming the second region 720 adjacent to the border region 715) includes at least a third row of the plurality of rows. In some embodiments, during the first period, the sensor electrodes included in the plurality of columns are operated as guarding sensor electrodes. During a different second period, the first portion, the second portion, and the plurality of mitigation (or sensor) electrodes correspond to different column(s) of the plurality of columns. During the second period, the sensor electrodes included in the plurality of rows are operated as guarding sensor electrodes.

In some embodiments, the amplitude of the mitigation signal 440 (i.e., M2) may be determined based on the amplitude of the sensing signal 430 (i.e., M1) and the relative areas driven at the first amplitude and the second amplitude. For example, the amplitude M2 may be determined according to the following relationship:

$$M2 \alpha \frac{M1(A_{M1})}{A_{M2}}, \quad (1)$$

where M1 represents an amplitude of the sensing signal 430 and of the guarding signal 435, $A_{M1}$ represents an area of the arrangement 700 driven at the amplitude M1, and $A_{M2}$ represents an area of the arrangement 700 driven at the amplitude M2. For example, as shown in FIG. 7 and assuming that Rows 1-10 and Columns 1-11 each correspond to a respective 50% of the sensor area, approximately 25% of the overall sensor area is driven with the sensing signal 430 (i.e., Rows 1-5) and approximately 55% of the overall sensor area is driven with the guarding signal 435 (i.e., 50% for Columns 1-11 and 5% for Row 6), which sums to an area $A_{M1}$ of 80%. The remaining 20% of the overall sensor area is driven with the mitigation signal 440, corresponding to an area $A_{M2}$ of 20%. Thus, according to Equation (1), M2 may be selected as (80%/20%) of M1, or (4*M1). As a result, driving the sensor electrodes 120 of arrangement 700 with the amplitudes M1, M2 results in substantially equal and opposite EM emissions at a particular distance from the sensor electrodes 120.

Thus, driving the sensor electrodes of arrangement 700 in the manner depicted may be suitable to acquire a first capacitive measurement including Rows 1-5 and corresponding to half of a first (vertical) axis during a first time period. During a second time period, a second capacitive measurement can be acquired corresponding to the other half of the first axis. In such a case, sensor electrodes 120 of Rows 6-10 may be driven with the sensing signal 430, Row 5 may be driven with the guarding signal 435, and Rows 1-4 may be driven with the mitigation signal 440. The sensor electrodes of Columns 1-11 may continue to be driven with the guarding signal 435. During other periods, capacitive measurements may be acquired for a second (horizontal) axis, e.g., by driving a first portion of the sensor electrodes 120 included in Columns 1-11 with the sensing signal 430, a second portion with the guarding signal 435, and a third portion with the mitigation signal 440. The sensor electrodes 120 included in Rows 1-10 may be driven with the guarding signal 435.

One or more other factors may be considered when determining the amplitude M2. The one or more other factors may be uniformly applied to the sensor area (or "symmetric") and/or differently applied for different portions of the sensor area (or "asymmetric"). In some embodiments, and based on the one or more other factors, mitigation is performed during a first time period by driving a first number of sensor electrodes with the mitigation signal 440 having a first amplitude, and mitigation is performed during a second time period using a different, second number of sensor electrodes and/or a different, second amplitude of the mitigation signal 440. A non-limiting example of the one or more other factors that may influence the amplitude M2 is EM emissions from routing traces that are coupled with the sensor electrodes 120. Based on the placement of the routing traces relative to the sensor area, the factor may be asymmetrically applied. Other non-limiting examples of the one or more other factors include the RC time constants of the sensor electrodes driven with the different signals, the polarization of the different signals, presence of conductors and/or shields in the vicinity, and so forth.

Figure 8:
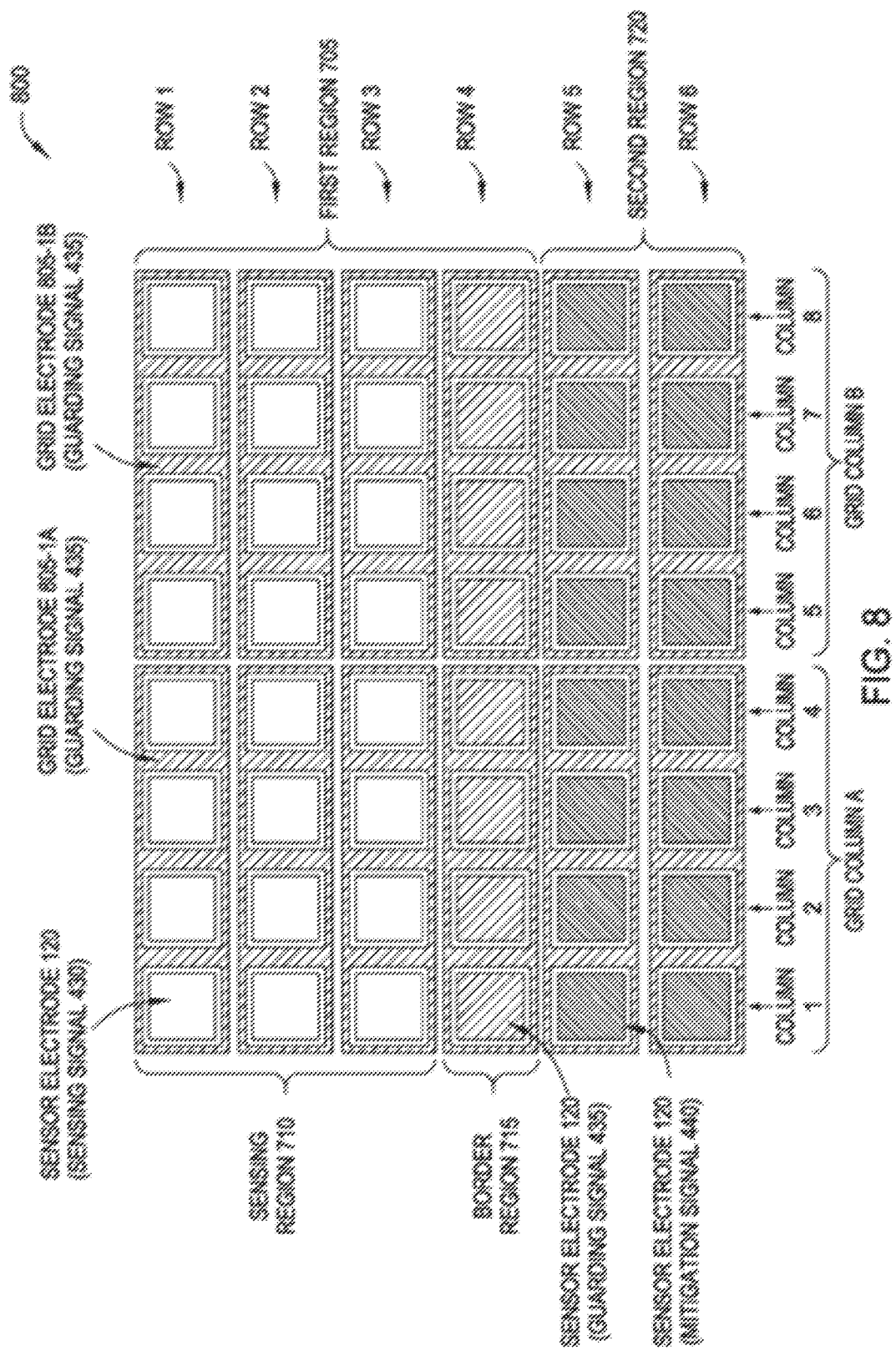
FIG. 8 is a diagram illustrating an exemplary arrangement of sensor electrodes for performing active reduction of electromagnetic emissions, according to embodiments described herein.

FIG. 8 is a diagram illustrating an exemplary arrangement 800 of sensor electrodes for performing active reduction of electromagnetic emissions, according to embodiments described herein. Sensor electrodes that are depicted in the arrangement 800 may be operated in conjunction with other embodiments, such as using the processing system of arrangement 400 of FIG. 4A and/or the method 500 of FIG. 5.

As shown, the plurality of sensor electrodes depicted in arrangement 800 is arranged in a repeating grid pattern forming a plurality of six (6) rows and a plurality of eight (8) columns, although other sizes are also possible. Each of the sensor electrodes in arrangement 800 is included in a particular row and a particular column. Further, each of the sensor electrodes depicted in arrangement 800 is at least partly circumscribed by a grid electrode, such as grid electrodes 805-1A, 805-1B. As shown, each grid electrode circumscribes four sensor electrodes, although other numbers of sensor electrodes are possible. Further, the grid electrodes are arranged in a repeating grid pattern. As shown, the grid electrodes 805-1A, 805-1B are arranged in Row 1, grid electrode 805-1A is arranged in Grid Column A, and grid electrode 805-1B is arranged in Grid Column B.

In some embodiments, each sensor electrode of arrangement 800 that is included in a particular row is electrically connected, such that desired signals can be driven onto each individual row during operation. However, other implementations may include individually driven sensor electrodes or in different groupings of sensor electrodes. For example, each group of four (4) sensor electrodes that are circumscribed by a particular grid electrode may be electrically connected and driven together.

As shown, sensor electrodes 120 that are included in Rows 1-3 are driven with the sensing signal 430, sensor electrodes 120 in Rows 5, 6 are driven with a mitigation signal 440, and sensor electrodes 120 included in Row 4 are driven with a guarding signal 435. In some embodiments, the sensing signal 430 and the guarding signal 435 are the same, but sensor electrodes 120 that are driven with the guarding signal 435 are not included in capacitive measurements. Each of the grid electrodes may be driven with the guarding signal 435, although in other embodiments, one or more grid electrodes may be driven with a different signal. For example, the grid electrodes included in Rows 5, 6 (which circumscribe the sensor electrodes 120 driven with the mitigation signal 440) may also be driven with the mitigation signal 440.

The contiguous first region 705 is formed by a plurality of first sensor electrodes 120 that are driven with the sensing signal 430 or with the guarding signal 435. As shown, the contiguous first region 705 comprises the sensor electrodes 120 included in Rows 1-4. In some embodiments, the first region 705 may further include the grid electrodes included in Rows 1-4.

The second region 720 is formed by a plurality of second sensor electrodes 120 that are driven with the mitigation signal 440. As shown, the second region 720 comprises the sensor electrodes 120 included in Rows 5, 6. In some embodiments, the second region 720 may further include grid electrodes that are driven with the mitigation signal 440.

The sensing region 710 is formed by the sensor electrodes 120 that are driven with the sensing signal 430. As shown, the sensing region 710 extends to include the sensor electrodes 120 of Rows 1-3. A border region 715 is formed within the contiguous first region 705, and is disposed adjacent to the second region 720. The sensor electrodes 120 disposed within the border region 715 are generally configured to guard the sensing region 120 from the effects of the mitigation signal 440 driven onto the sensor electrodes of the second region 120. In some embodiments, the size of the border region 715 may be determined based on the relative sizes of the sensing region 710 and/or the second region 720, and/or the relative amplitudes of the sensing signal 430 and/or the mitigation signal 440. In some alternate embodiments, if the grid electrodes (such as grid electrodes 805-1A and 805-1B) are large enough, a distinct border region 715 may not be needed to suitably guard the sensor electrodes of the sensing region 710.

Thus, driving the sensor electrodes of arrangement 800 in the manner depicted may be suitable to acquire a first capacitive measurement including sensor electrodes 120 of Rows 1-3 and corresponding to half of a first (vertical) axis during a first time period. Consistent with the discussion above, additional capacitive measurements may be acquired along the first axis and/or a second (horizontal) axis in other time periods.

Figure 9:
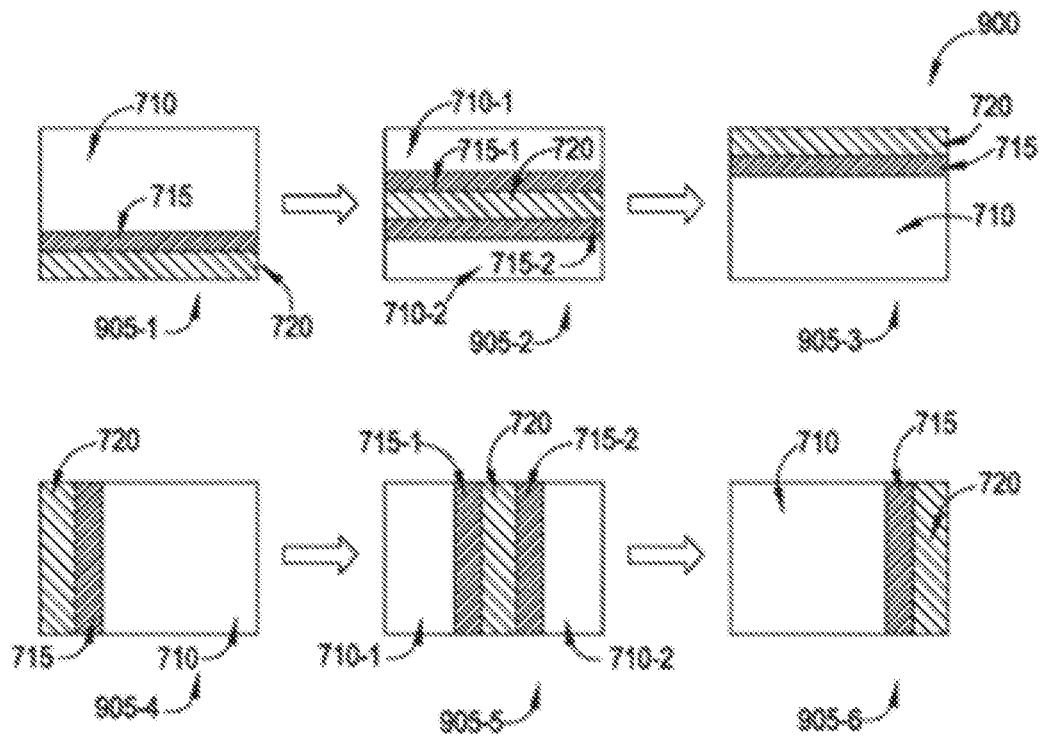
FIG. 9 is a diagram illustrating an exemplary scan sequence while performing active reduction of electromagnetic emissions, according to embodiments described herein.

FIG. 9 is a diagram 900 illustrating an exemplary scan sequence while performing active reduction of electromagnetic emissions, according to embodiments described herein. The scan sequence may be performed in conjunction with other embodiments, such as using the arrangements 700 and 800 of sensor electrodes depicted in FIGS. 7 and 8. In the scan sequence shown in diagram 900, sensing occurs along a first (vertical) axis between times 905-1 and 905-3, and along a second (horizontal) axis between times 905-4 and 905-6.

At time 905-1, the sensing region 710 includes an uppermost portion of the first axis. The sensing region 710 is separated from the second region 720 (that is, driven with the mitigation signal) by the border region 715. At time 905-2, capacitive measurements are acquired from two separate sensing regions 710-1 and 710-2 and the second region 720 is located partway along the first axis. In this case, a first border region 715-1 separates the second region 720 from the sensing region 710-1, and a second border region 715-2 separates the second region 720 from the sensing region 710-2. At time 905-3, the sensing region 710 includes a lowermost portion of the first axis.

At time 905-4, the sensing region 710 includes a rightmost portion of the second axis. The sensing region 710 is separated from the second region 720 by the border region 715. At time 905-5, capacitive measurements are acquired from two separate sensing regions 710-1 and 710-2 and the second region 720 is located partway along the second axis. In this case, a first border region 715-1 separates the second region 720 from the sensing region 710-1, and a second border region 715-2 separates the second region 720 from the sensing region 710-2. At time 905-6, the sensing region 710 includes a leftmost portion of the second axis.

Figure 10:
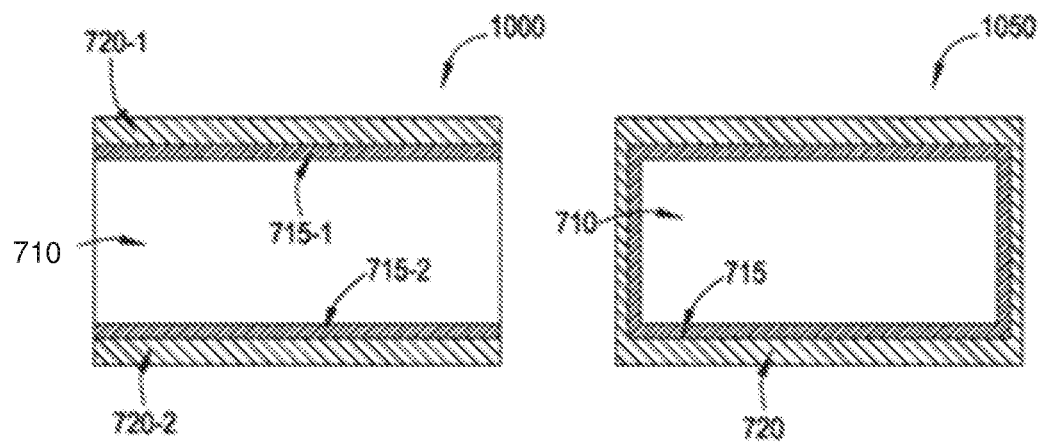
FIG. 10 is a diagram illustrating exemplary arrangements having a mitigation region that at least partly circumscribes a sensing region, according to embodiments described herein.

FIG. 10 is a diagram illustrating exemplary arrangements 1000 and 1050 having a mitigation region that at least partly circumscribes a sensing region, according to embodiments described herein. The scan sequence may be performed in conjunction with other embodiments, such as using the arrangements 700 and 800 of sensor electrodes depicted in FIGS. 7 and 8.

In arrangement 1000, the sensing region 710 is partly circumscribed by mitigation region(s). More specifically, the sensing region 710 is disposed between a first mitigation region (shown as second region 720-1) and a second mitigation region (shown as second region 720-2). In this case, a first border region 715-1 separates the second region 720-1 from the sensing region 710, and a second border region 715-2 separates the second region 720-2 from the sensing region 710. In arrangement 1050, the sensing region 710 is fully circumscribed by the mitigation region (i.e., the second region 720). In this case, a border region 715 also circumscribes the sensing region 710.

In some embodiments, the sensing region 710 of arrangements 1000 and 1050 may have a relatively static positioning. The arrangements 1000 and 1050 can be beneficial in that capacitive measurements may be acquired for the entire sensing region 710 (e.g., in one or more axes) within a single time period, while the mitigation region(s) can mitigate the EM emissions produced by driving sensor electrodes of the sensing region 710. In some cases, such as in arrangements 1000 and 1050 the mitigation region(s) and border region(s) can extend along a longest dimension of the sensing region 710. In some cases, such as in arrangement 1050, the mitigation region(s) and/or border region(s) may have a greater thickness along a longest dimension of the sensing region 710, and a lesser thickness along another dimension of the sensing region 710.

Figure 11:
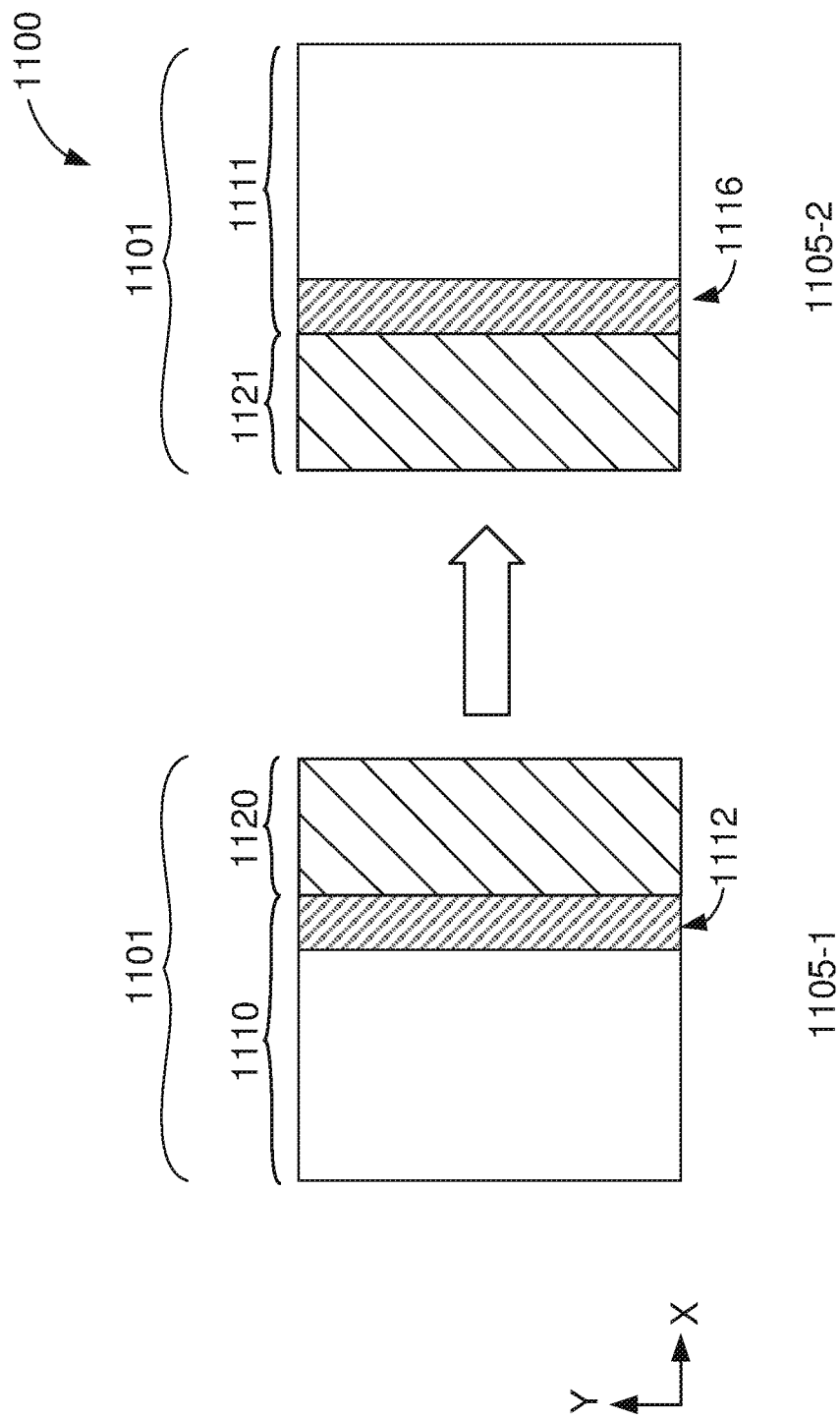
FIG. 11 is a diagram illustrating another exemplary scan sequence while performing active reduction of electromagnetic emissions, according to embodiments described herein.

FIG. 11 is a diagram 1100 illustrating another exemplary scan sequence that can be performed while performing active reducing electromagnetic emissions, according to embodiments described herein. The scan sequence may be performed in conjunction with other embodiments, such as the arrangements 700 and 800 of sensor electrodes depicted in FIGS. 7 and 8, or the method 1200 of FIG. 12. The diagram 1100 shows sensor electrodes 1101 at a first time 1105-1 and at a second time 1105-2. In some embodiments, the sensor electrodes 1101 may be arranged along a first axis. As shown, scanning may be performed along the horizontal axis by the sensor electrodes 1101. In other embodiments, scanning may be performed along the vertical axis by the sensors electrodes 1101 (not shown for simplicity). In still other embodiments, scanning may be performed along any feasible direction or axis.

Sensing occurs by driving a first set of the sensor electrodes 1101 with a first modulated signal (sometimes referred to as a sensing signal), and concurrently driving a second set of the sensor electrodes 1101 with a second modulated signal. The second modulated signal (sometimes referred to as a mitigation signal) may be selected to achieve a full or partial mitigation of electromagnetic emissions resulting from the first set of sensor electrodes 1101. In some aspects, the second modulated signal may be an inverted version of the first modulated signal. In some embodiments, the sensing may be performed by an input device 100 operating in a doze mode.

At time 1105-1, the sensor electrodes 1101 may be divided into a first set of sensor electrodes 1110 and a second set of sensor electrodes 1120. In some embodiments the area associated with the first set of sensor electrodes may be different from the area associated with the second set of sensor electrodes. For example, area associated with the first set of sensor electrodes may be greater than the area associated with the second set of sensor electrodes. In other embodiments, the number of electrodes in the first set of sensor electrodes may different from the number of electrodes in the second set of sensor electrodes. For example, the number of electrodes in the first set of sensor electrodes may be greater than the number of electrodes associated with the second set of sensor electrodes. In still other embodiments, other arrangements of area and or number of sensor electrodes are possible.

The first set of sensor electrodes 1110 may be driven with the first modulated signal. The second set of sensor electrodes 1120 may be driven with the second modulated signal to mitigate emissions from the first set of sensor electrodes 1110. In some embodiments, the amplitude of the second modulated signal may be based on the area of the first set of sensor electrodes and area of the second set of sensor electrodes, for example as described with respect to equation 1. For example, If the area of the first set of sensor electrodes is larger than the area of the second set of sensor electrodes, then the amplitude of the second modulated signal may be larger than the amplitude of the first modulated signal. On the other hand, if the area of the second set of sensor electrodes is larger than the area of the first set of sensor electrodes, then the amplitude of the second modulated signal may be smaller than the amplitude of the first modulated signal.

In other embodiments, the amplitude of the second modulated signal may be based on the number of electrodes in the first set of sensor electrodes and the number of electrodes in the second set of sensor electrodes. For example, If the number of electrodes in the first set of sensor electrodes is greater than the number of electrodes in the second set of sensor electrodes, then the amplitude of the second modulated signal may be larger than the amplitude of the first modulated signal. On the other hand, if the number of electrodes in the first set of sensor electrodes is less than the number of electrodes in the second set of sensor electrodes, then the amplitude of the second modulated signal may be smaller than the amplitude of the first modulated signal.

Capacitive measurements may be acquired from the first set of sensor electrodes 1110. In some embodiments, the first set of sensor electrodes 1110 may include some electrodes disposed in a border region 1112. Sensor electrodes in the border region 1112 may also be driven with the first modulated signal. In some cases, the capacitive measurements may be acquired from the first set of sensor electrodes 1110 that are not within the border region 1112.

At time 1105-2, the sensor electrodes 1101 may be divided into a first set of sensor electrodes 1111 and a second set of sensor electrodes 1121. One or more of the sensor electrodes that were previously included in the second set of sensor electrodes 1120 may now be included in the first set of sensor electrodes 1111. Further, one or more sensor electrodes that were previous included in the first set of sensor electrodes 1110 may now be included in the second set of sensor electrodes 1121. In some embodiments, the area associated with the first set of sensor electrodes 1111 may be larger than the area associated with the second set of sensor electrodes 1121. The first set of sensor electrodes 1111 may be driven with the first modulated signal and the second set of sensor electrodes 1121 may be driven with the second modulated signal to mitigate emissions from the first set of sensor electrodes 1111. Capacitive measurements may be acquired from the first set of sensor electrodes 1111. In some embodiments, the first set of sensor electrodes 1111 may include some electrodes disposed in a border region 1116. Sensor electrodes in the border region 1116 may also be driven with the first modulated signal. In some cases, the capacitive measurements may be acquired from the first set of sensor electrodes 1111 that are not within the border region 1116.

Using the scan sequence depicted in diagram 1100, an entire sensing region of an input device 100 may be quickly scanned using only two capacitive measurements. In some embodiments, scanning the entire sensing region may detect the presence of an input object and may cause the input device 100 to transition out of a doze mode.

Figure 12:
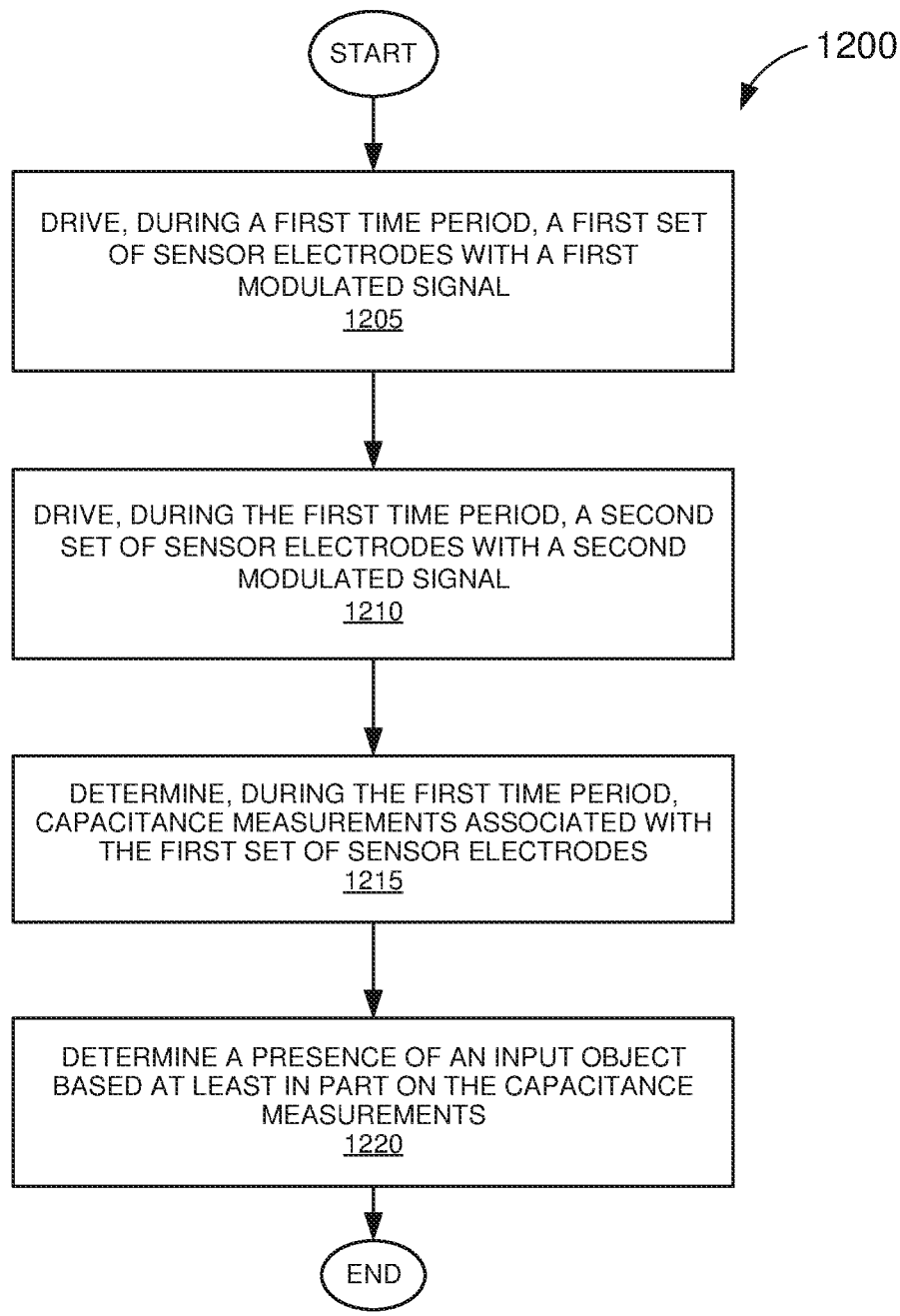
FIG. 12 illustrates another method of performing active reduction of electromagnetic emissions, according to some embodiments.

FIG. 12 illustrates a method 1200 of performing active reduction of electromagnetic emissions, according to embodiments described herein. The method 1200 may be performed in conjunction with other embodiments, such as the processing system of arrangement 400 of FIG. 4A, the method 500 of FIG. 5, the method 600 of FIG. 6, the arrangement 700 of sensor electrodes of FIG. 7, and the arrangement 800 of sensor electrodes of FIG. 8. In some embodiments, method 1200 may be performed during operation of the sensor module 310 and the display driver module 320 of the arrangement 300, where the sensor module 310 comprises a first integrated controller and the display driver module 320 comprises a second integrated controller.

The method 1200 begins at block 1205. With reference to FIGS. 3 and 11, the sensor module 310 drives, during a first time period, a first set of sensor electrodes with a first modulated signal. A subset of the first set of sensor electrodes may form a border region. In some embodiments, during the first time period the sensor module 310 may drive the sensor electrodes within the border region with a guarding signal. In some aspects, the guarding signal may be similar to the first modulated signal. The first set of sensor electrodes may be disposed entirely or substantially along a single axis. For example, the first set of sensor electrodes may be disposed along the X, Y or any other feasible axis.

At block 1210, the sensor module 310 drives, during the first time period, a second set of sensor electrodes with a second modulated signal. The second modulated signal may be an inverted version of the first modulated signal and have an amplitude that is different than an amplitude of the first modulated signal. The second set of sensor electrodes may be disposed or positioned similar to the first set of sensor electrodes. Thus, the first set of sensor electrodes and the second set of sensor electrodes may be arranged in a common direction or along a common axis. The second set of electrodes may be adjacent to the first set of electrodes (and in some cases adjacent to the border region) and may mitigate electromagnetic emissions resulting from driving the first set sensor electrodes. In some embodiments, during the first time period and while the sensor module 310 drives the first and second set of sensor electrodes, the display driver module 320 may drive a third set sensor electrodes with the first modulated signal or the guarding signal. The third set of sensor electrodes may be disposed substantially orthogonal to the first and second set of sensor electrodes.

At block 1215, the sensor module 310 determines, during the first time period, capacitive measurements (e.g., a capacitive value) associated with the first set of sensor electrodes. In some embodiments, the capacitive measurements may be absolute capacitive measurements determined based on the first set of sensor electrodes not included within the border region.

At block 1220, the sensor module 310 determines the presence of an input object based at least in part on the capacitive measurements. For example, the capacitive measurements may indicate an increase in detected capacitance (based on previous measurements). The increased capacitance may be associated with an input object proximate to the first set of sensor electrodes. In some embodiments, upon the determination of the presence of an input object, one or more portions of the input device 100 may transition from a doze mode to an active mode. The method 1200 may be repeated after "swapping" the first set of sensor electrodes with the second set of sensor electrodes. In this manner, capacitive sensing may be performed with the second set of sensor electrodes while the first set of sensor electrodes are used to mitigate electromagnetic emissions. Moreover, the method 1200 may be repeated any number of times until, for example, the detection of an input object.

The features described herein may be embodied in suitable alternate forms. In one non-limiting example, mitigation signals may be driven for a software-defined 1D slider button and/or groups of software-defined 2D buttons. In the case of 2D buttons, given a sufficient distance between the 2D buttons, a processing system can perform capacitive measurements corresponding to one set of 2D buttons by driving a sensing waveform, and can simultaneously measure another set of 2D buttons (having an approximately same area) by driving an inverse waveform. In another non-limiting example, a system defining multiple touch-sensitive areas, inverse waveforms of appropriate amplitudes can be used to achieve a net cancellation across the sum of the sensing areas.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, embodiments have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A method of capacitive sensing using an array of sensor electrodes, comprising:
   driving, during a first time period, a first set of the sensor electrodes with a first modulated signal;
   generating a second modulated signal based at least in part on an inversion of the first modulated signal;
   driving, during the first time period, a second set of the sensor electrodes with the second modulated signal to reduce electromagnetic emissions associated with the first set of the sensor electrodes;

driving, during a second time period, at least the second set of the sensor electrodes with the first modulated signal;

driving, during the second time period, at least a first subset of the sensor electrodes in the first set with the second modulated signal; and determining, during the first time period, a first capacitance value associated with the first set of the sensor electrodes.

2. The method of claim 1 further comprising:
determining a presence of an input object based at least in part on the first capacitance value.

3. The method of claim 1, wherein the first set of the sensor electrodes and the second set of the sensor electrodes are oriented along a common axis of the array.

4. The method of claim 1, wherein the first capacitance value is associated with an absolute capacitance measurement.

5. The method of claim 1, further comprising:
driving, during the first time period, a third set of sensor electrodes with the first modulated signal, wherein the third set of sensor electrodes is disposed orthogonally with respect to the first set of the sensor electrodes.

6. The method of claim 1, wherein the first set of the sensor electrodes includes more sensor electrodes than the second set of the sensor electrodes, and wherein the second modulated signal is driven with a different amplitude than an amplitude of the first modulated signal.

7. The method of claim 1, wherein the second set of sensor electrodes include more sensor electrodes than the first set of sensor electrodes, and wherein the first modulated signal is driven with a different amplitude than an amplitude of the second modulated signal.

8. The method of claim 1, further comprising:
driving, during the second time period, a second subset of the first set of the sensor electrodes, different than the first subset, with the first modulated signal.

9. The method of claim 8, further comprising:
determining, during the second time period, a second capacitance value associated with the second set of the sensor electrodes and the second subset of the first set of the sensor electrodes; and
determining a presence of an input object based at least in part on the second capacitance value.

10. An input device comprising:
an array of sensor electrodes comprising:
a first set of sensor electrodes; and
a second set of sensor electrodes; and
a processing system configured to:
drive, during a first time period, the first set of the sensor electrodes with a first modulated signal;
generate a second modulated signal based at least in part on an inversion of the first modulated signal;
drive, during the first time period, the second set of the sensor electrodes with the second modulated signal to reduce electromagnetic emissions associated with the first set of the sensor electrodes;
drive, during a second time period, at least the second set of the sensor electrodes with the first modulated signal;
drive, during the second time period, at least a first subset of the sensor electrodes in the first set with the second modulated signal; and
determine, during the first time period, a first capacitance value associated with the first set of the sensor electrodes.

11. The input device of claim 10, wherein the processing system is further configured to:
determine a presence of an input object based at least in part on the first capacitance value.

12. The input device of claim 10, wherein the first set of the sensor electrodes and the second set of the sensor electrodes are oriented along a common axis of the array.

13. The input device of claim 10, wherein the first capacitance value is associated with an absolute capacitance measurement.

14. The input device of claim 10, wherein the processing system is further configured to:
drive, during the first time period, a third set of sensor electrodes with the first modulated signal, wherein the third set of sensor electrodes is disposed orthogonally with respect to the first set of the sensor electrodes.

15. The input device of claim 10, wherein the first set of the sensor electrodes includes more sensor electrode area than the second set of the sensor electrodes, and wherein the processing system is further configured to drive the second modulated signal with an amplitude greater than an amplitude of the first modulated signal.

16. The input device of claim 10, wherein the second set of the sensor electrodes includes more sensor electrode area than the first set of the sensor electrodes, and wherein the processing system is further configured to drive the first modulated signal with an amplitude greater than an amplitude of the second modulated signal.

17. The input device of claim 10, wherein the processing system is further configured to:
drive, during the second time period, a second subset of the first set of the sensor electrodes, different than the first subset, with the first modulated signal;
determine, during the second time period, a second capacitance value associated with the second set of the sensor electrodes and the second subset of the first set of the sensor electrodes; and
determine a presence of an input object based at least in part on the second capacitance value.

18. A processing system comprising:
means for driving, during a first time period, a first set of sensor electrodes with a first modulated signal;
means for generating a second modulated signal based at least in part on an inversion of the first modulated signal;
means for driving, during the first time period, a second set of sensor electrodes with the second modulated signal to reduce electromagnetic emissions associated with the first set of the sensor electrodes;
means for driving, during a second time period, at least the second set of the sensor electrodes with the first modulated signal;
means for driving, during the second time period, at least a first subset of the sensor electrodes in the first set with the second modulated signal; and
means for determining, during the first time period, a first capacitance value associated with the first set of the sensor electrodes.

19. The processing system of claim 18, further comprising:
means for determining a presence of an input object based at least in part on the first capacitance value.

* * * * *